(12) United States Patent  (10) Patent No.: US 7,679,107 B2
Yukawa  (45) Date of Patent: Mar. 16, 2010

(54) MEMORY DEVICE THAT UTILIZES ORGANIC LAYER WITH A COMPOUND THAT CAN PHOTOISOMERIZE BETWEEN CONDUCTIVE LAYERS; AT LEAST ONE OF WHICH IS LIGHT TRANSMITTING

(75) Inventor: Mikio Yukawa, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 764 days.

(21) Appl. No.: 11/411,829

(22) Filed: Apr. 27, 2006

(65) Prior Publication Data

US 2006/0246269 A1  Nov. 2, 2006

(30) Foreign Application Priority Data

Apr. 28, 2005  (JP) .............................. 2005-133629

(51) Int. Cl.
  *H01L 35/24* (2006.01)
  *H01L 51/00* (2006.01)
(52) U.S. Cl. ..................... 257/209; 257/40; 257/202; 257/414; 257/431; 257/443; 257/E51.012; 257/E51.013; 257/E51.014; 257/E51.015; 257/E51.016; 257/E51.017
(58) Field of Classification Search ................ 257/40, 257/431, E29.324, E21.645–E21.694, 228, 257/214, 298, 202, 209, 414, 443, E51.012–E51.017; 438/95
See application file for complete search history.

(56) References Cited

U.S. PATENT DOCUMENTS

| | | | |
|---|---|---|---|
| 6,413,680 B1 * | 7/2002 | Watanabe et al. | 430/5 |
| 6,433,270 B1 * | 8/2002 | Rack | 136/263 |
| 6,623,900 B1 * | 9/2003 | Saito | 430/78 |
| 6,815,706 B2 * | 11/2004 | Li et al. | 257/14 |
| 6,885,053 B1 * | 4/2005 | Tsujioka | 257/296 |
| 7,205,085 B2 * | 4/2007 | Nishimura et al. | 430/190 |
| 7,358,590 B2 | 4/2008 | Yukawa et al. | |
| 2002/0057398 A1 * | 5/2002 | Ogawa | 349/61 |
| 2005/0045877 A1 * | 3/2005 | Lyons et al. | 257/40 |
| 2005/0093045 A1 * | 5/2005 | Tsujioka | 257/296 |
| 2005/0145839 A1 * | 7/2005 | Yamamoto et al. | 257/40 |

(Continued)

FOREIGN PATENT DOCUMENTS

JP  2002-026277  1/2002

(Continued)

*Primary Examiner*—Anh D Mai
*Assistant Examiner*—Diana C Garrity
(74) *Attorney, Agent, or Firm*—Eric J. Robinson; Robinson Intellectual Property Law Office, P.C.

(57) ABSTRACT

The present invention provides an involatile memory device that is capable of data writing and erasing at a time other than during manufacturing, and a semiconductor device having the memory device. Also, the present invention provides a compact-sized and inexpensive involatile memory device and a semiconductor device having the memory device. A memory device of the present invention includes a first conductive layer and a second conductive layer of which at least one has a light transmitting property, and an organic compound layer that is in contact with the first conductive layer or the second conductive layer. The organic compound layer includes conductive particles that are dispersed within the layer, and the organic compound included in the organic compound layer has a site that can photoisomerize.

56 Claims, 16 Drawing Sheets

U.S. PATENT DOCUMENTS

| | | | |
|---|---|---|---|
| 2006/0051761 A1* | 3/2006 | Ijiro et al. | 435/6 |
| 2006/0092369 A1* | 5/2006 | Nishi | 349/172 |
| 2006/0214008 A1 | 9/2006 | Asami et al. | |
| 2006/0246643 A1 | 11/2006 | Ohsawa | |

FOREIGN PATENT DOCUMENTS

| | | |
|---|---|---|
| JP | 2004-294544 | 10/2004 |

* cited by examiner

MEMORY DEVICE THAT UTILIZES ORGANIC LAYER WITH A COMPOUND THAT CAN PHOTOISOMERIZE BETWEEN CONDUCTIVE LAYERS; AT LEAST ONE OF WHICH IS LIGHT TRANSMITTING

BACKGROUND OF THE INVENTION

1. Field of the Invention

The present invention relates to a memory device and a semiconductor device equipped with the memory device.

2. Description of the Related Art

In recent years, a semiconductor device having a plurality of circuits integrated over an insulating surface and various functions has been developed. Further, development of a semiconductor device capable of wireless data transmission/reception by providing an antenna has been advanced. Such semiconductor device is referred to as a wireless chip (also referred to as an ID tag, an IC tag, an IC chip, an RF (Radio Frequency) tag, a wireless tag, an electronic tag, or an RFID (Radio Frequency Identification) tag), and is already introduced to a part of the market.

Many of these semiconductor devices that have already been put into practical use include a circuit using a semiconductor substrate such as an Si substrate (also referred to as an IC (Integrated Circuit) chip) and an antenna, and the IC chip includes a memory circuit (also referred to as a memory), a control circuit and the like. In particular, by providing a memory circuit which can store much data, a high-value-added semiconductor device providing higher performance can be provided. In addition, there are demands that such semiconductor devices be manufactured at low cost, and in recent years, an organic TFT, an organic memory and the like using an organic compound for a control circuit, a memory circuit and the like have been actively developed (Reference 1: Japanese Patent Application Laid-Open No. 2002-26277). Further, an optical integrated waveguide element in which a diffractive optical element is recorded in a light guide using photo-induced surface relief granting system is proposed (Reference 2: Japanese Patent Application Laid-Open No. 2004-294544).

SUMMARY OF THE INVENTION

As a memory circuit, a DRAM (Dynamic Random Access Memory), an SRAM (Static Random Access Memory), an FeRAM (Ferroelectric Random Access Memory), a mask ROM (Read Only Memory), an EPROM (Electrically Programmable Read Only Memory), an EEPROM (Electrically Erasable and Programmable Read Only Memory), a flash memory and the like are given. Among them, a DRAM and an SRAM are volatile memory circuits in which data is erased when the power is turned off and it is necessary to write data every time the power is turned on. An FeRAM is an involatile memory circuit; however, since it uses a capacitor element including a ferroelectric layer, manufacturing steps thereof are increased. A mask ROM has a simple structure; however, data is required to be written during the manufacturing steps and cannot be additionally written. An EPROM, an EEPROM, and a flash memory are involatile memory circuits; however, an element having two gate electrodes is used, and thus, the manufacturing steps are increased.

In view of the foregoing problem, an object of the present invention is to provide an involatile memory device that is capable of writing and erasing data at a time other than during manufacturing, and a semiconductor device having the memory device. Also, an object of the present invention is to provide a compact-sized and inexpensive involatile memory device and a semiconductor device having the memory device.

A memory device of the present invention includes a memory element including a first conductive layer and a second conductive layer of which at least one has a light transmitting property, and an organic compound layer that is in contact with the first conductive layer or the second conductive layer. The organic compound layer includes conductive particles dispersed therein, and an organic compound included in the organic compound layer has a site that can photoisomerize.

A memory device of the present invention includes a memory element including a first conductive layer, an organic compound layer formed over the first conductive layer, and a second conductive layer having a light transmitting property that is provided on an opposite side of the first conductive layer with the organic compound layer interposed therebetween. The organic compound layer includes conductive particles dispersed therein, and an organic compound included in the organic compound layer has a site that can photoisomerize. Further, a gas is filled between the organic compound layer and the second conductive layer having a light transmitting property.

A memory device of the present invention includes a reading circuit and a memory cell array in which memory elements are arranged in a matrix form. Each of the memory elements has a first conductive layer and a second conductive layer of which at least one has a light transmitting property, and an organic compound layer that is in contact with the first conductive layer or the second conductive layer. The organic compound layer includes conductive particles dispersed therein, and an organic compound included in the organic compound layer has a site that can photoisomerize.

A memory device of the present invention includes a reading circuit and a memory cell array in which memory elements are arranged in a matrix form. Each of the memory elements has a first conductive layer, an organic compound layer formed over the first conductive layer, and a second conductive layer having a light transmitting property that is provided on an opposite side of the first conductive layer with the organic compound layer interposed therebetween. The organic compound layer includes conductive particles dispersed therein, and an organic compound included in the organic compound layer has a site that can photoisomerize. Further, a gas is filled between the organic compound layer and the second conductive layer.

A memory device of the present invention includes a reading circuit and a memory cell array in which memory cells are arranged in a matrix form. Each of the memory cells includes a transistor and a memory element, and the memory element includes a first conductive layer and a second conductive layer of which at least one has a light transmitting property, and an organic compound layer that is in contact with the first conductive layer or the second conductive layer. The organic compound layer includes conductive particles dispersed therein, and an organic compound included in the organic compound layer has a site that can photoisomerize.

A memory device of the present invention includes a reading circuit and a memory cell array in which memory cells are arranged in a matrix form. Each of the memory cells includes a transistor and a memory element, and the memory element includes a first conductive layer, an organic compound layer formed over the first conductive layer, and a second conductive layer having a light transmitting property that is provided on an opposite side of the first conductive layer with the organic compound layer interposed therebetween. The organic compound layer includes conductive particles dispersed therein, and an organic compound included in the organic compound layer has a site that can photoisomerize. Further, a gas is filled between the organic compound layer and the second conductive layer.

A semiconductor device of the present invention includes a memory element, a conductive layer functioning as an antenna, a first transistor connected to a conductive layer of the memory element, and a second transistor connected to the conductive layer functioning as an antenna.

In the foregoing memory device and semiconductor device, a portion of the organic compound layer is irradiated with light and isomerized so that a periphery of the portion of the organic compound layer irradiated with light becomes a projected portion. Writing is carried out by the first conductive layer and the second conductive layer coming into contact at the projected portion.

Note that in the memory device and the semiconductor device, a light irradiation means for writing data may be provided on the first conductive layer side or the second conductive layer side having a light transmitting property. Also, a heating means for erasing data may be provided on the first conductive layer side or the second conductive layer side whichever one having a light transmitting property.

Also, in the foregoing memory device and semiconductor device, a first substrate over which the first conductive layer is formed, a second substrate over which the second conductive layer is formed, and the organic compound layer are sealed together with a sealant. Further, a space-maintaining material (spacer) is interposed between the first substrate and the second substrate so that a distance between the first conductive layer and the second conductive layer is maintained to be constant.

Further, a gas is filled between the second conductive layer and the organic compound layer. As the gas, one or more of nitrogen, oxygen, carbon dioxide, and a noble gas is used.

Furthermore, the site that can photoisomerize has an azo group, an alkenyl group, or an imine group. The following representative examples are given as the organic compound having the site that can photoisomerize. As a compound having an azo group, azobenzene, azopyridine, azonaphthalene, or the like is given; and as a compound having an alkenyl group, stilbene, stilbazole, stilbazolium, chalcone, cyanine, fulgide, or the like is given.

The memory device of the present invention can write data by irradiating with light the memory element including the organic compound having a site that can photoisomerize. Also, data erasing is possible by heating the memory element or irradiating the memory element with light. Consequently, an involatile memory device that is capable of writing and erasing data at a time other than during manufacturing can be manufactured. Also, by the present invention, a compact-sized and inexpensive memory device and a semiconductor device can be manufactured.

BRIEF DESCRIPTION OF DRAWINGS

In the accompanying drawings.

Each of FIGS. 1A to 1C is a cross-sectional view describing a memory element of the present invention.

Figure 4A:
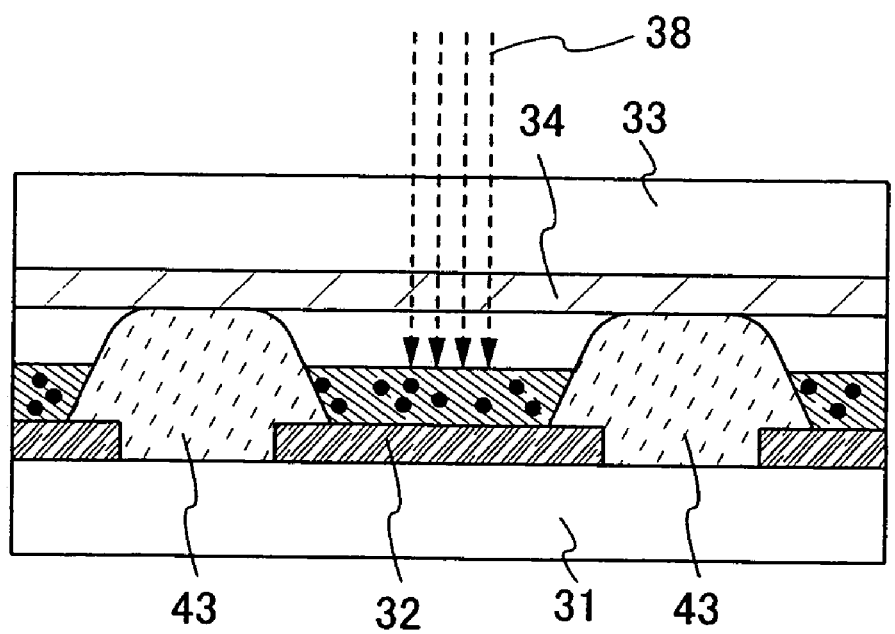
Figure 4B:
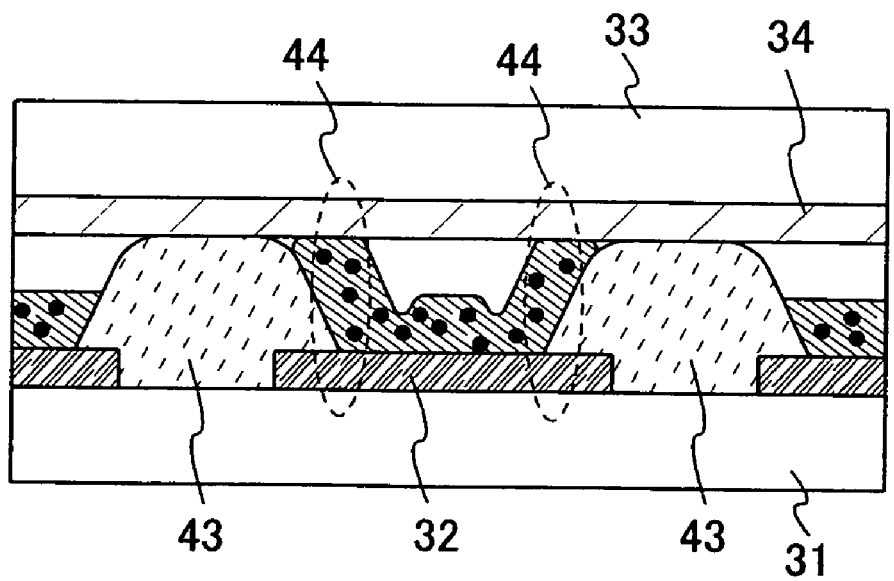

Each of FIGS. 4A and 4B is a cross-sectional view describing a memory element of the present invention.

Figure 5A:
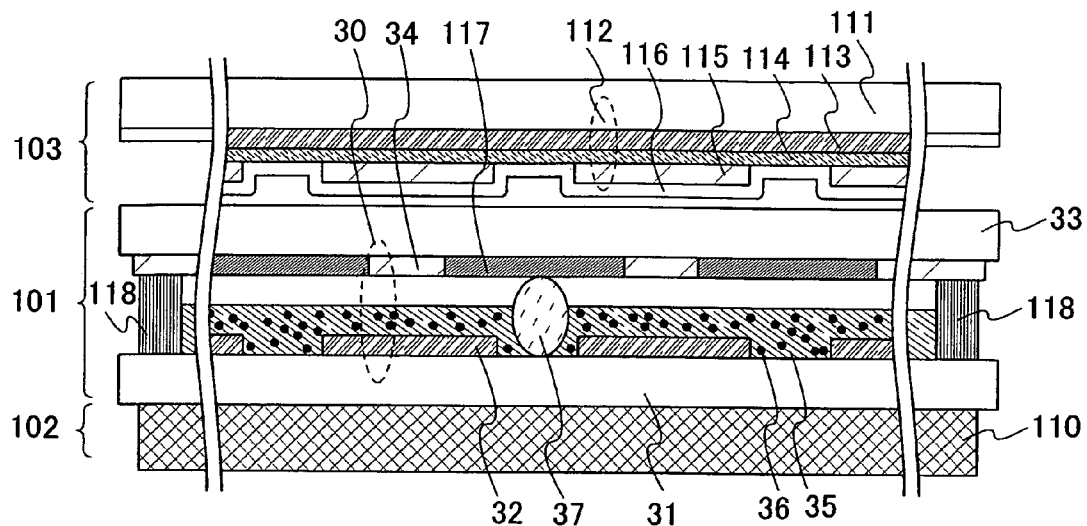
Figure 5B:
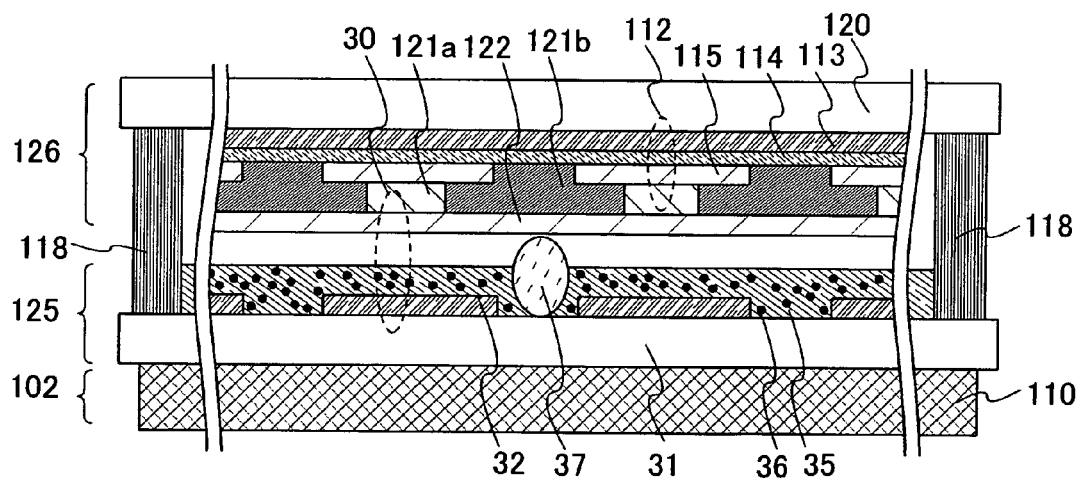
Figure 5C:
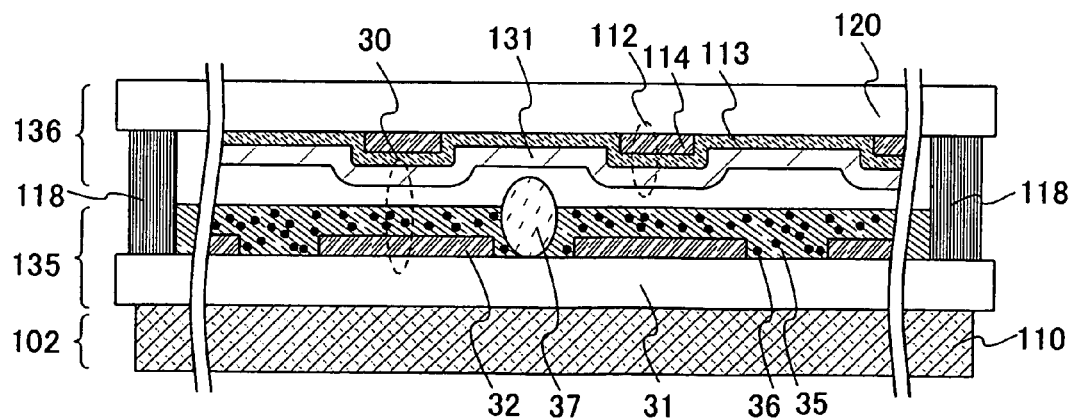

Each of FIGS. 5A to 5C is a cross-sectional view describing a memory device of the present invention.

Figure 6A:
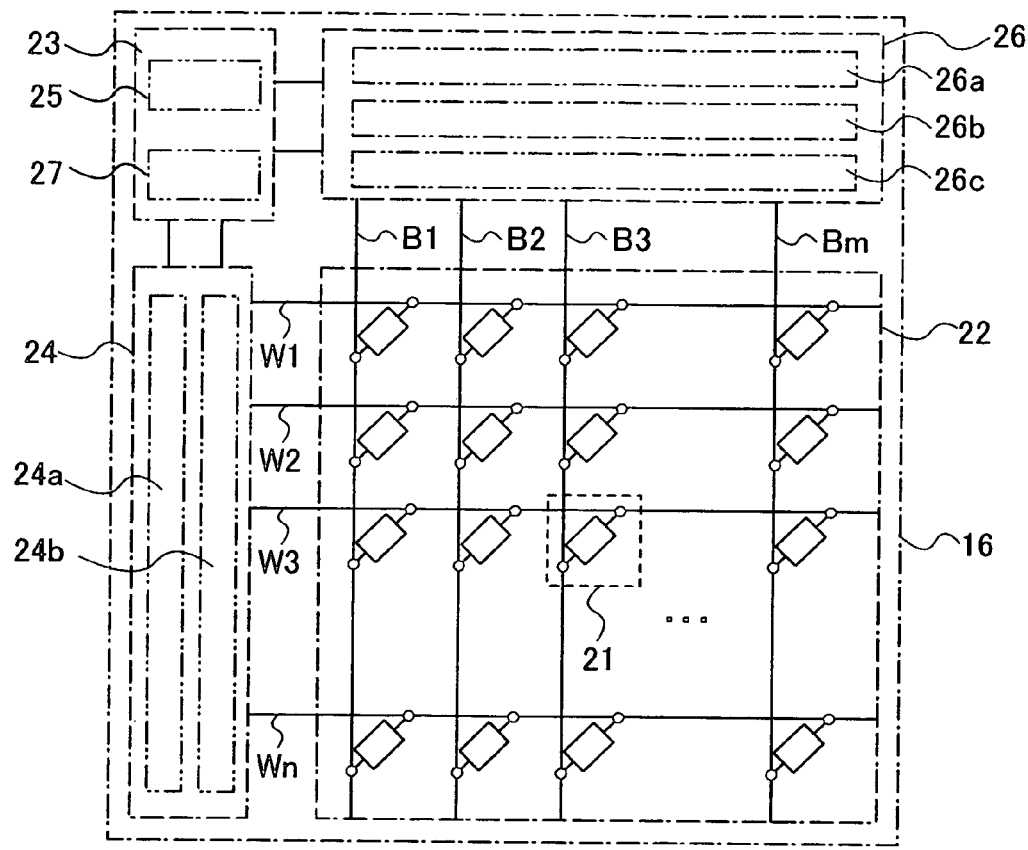
Figure 6B:
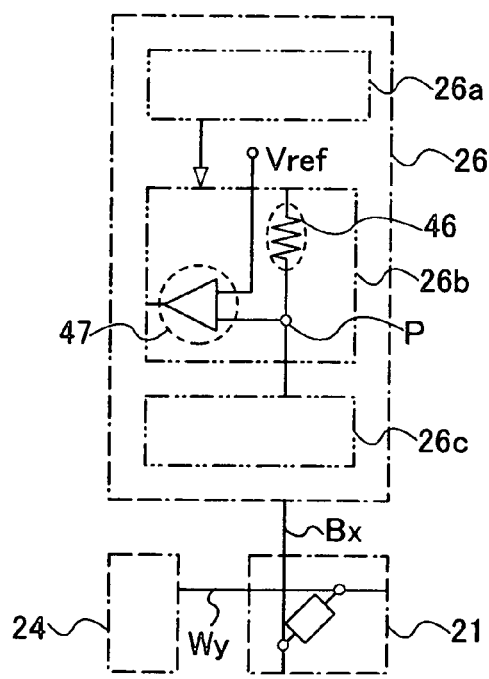
Figure 6C:
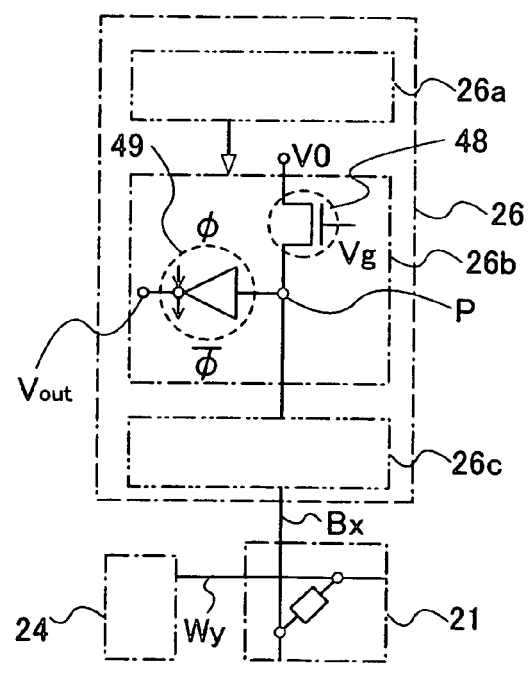

Each of FIGS. 6A to 6C is a view describing a memory device of the present invention.

Figure 7A:
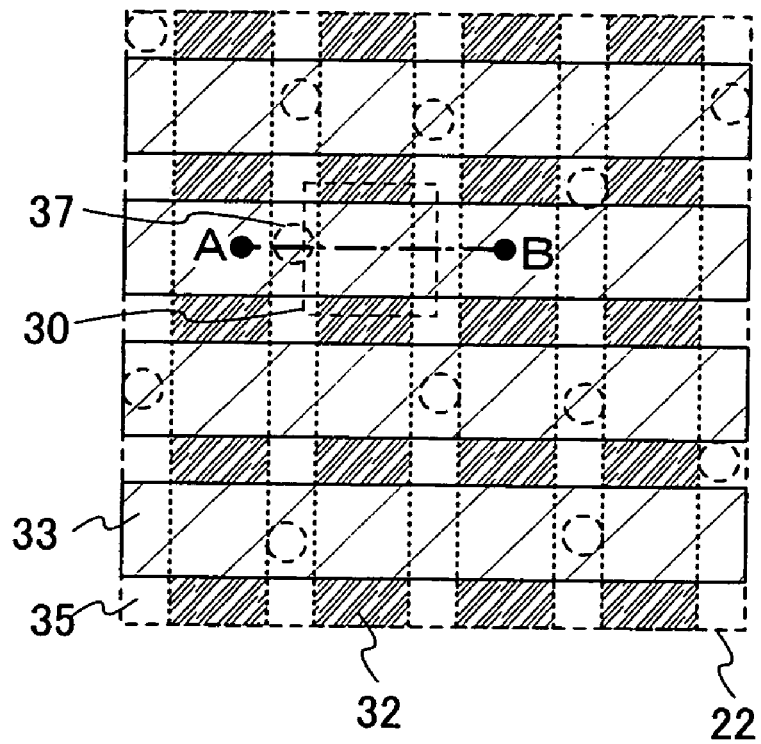
Figure 7B:
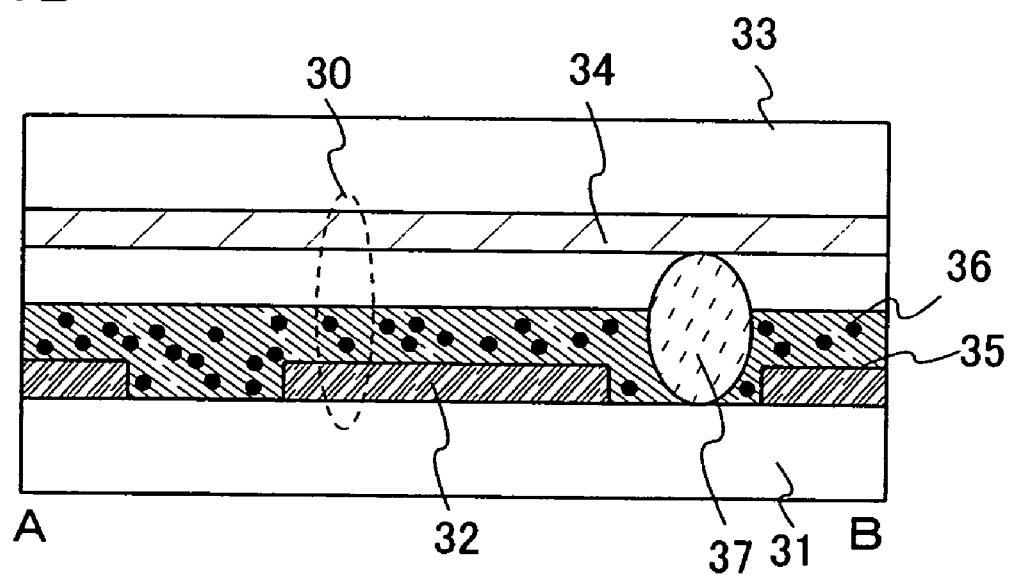

FIGS. 7A and 7B are an upper surface view and a cross-sectional view describing a memory device of the present invention.

Figure 8A:
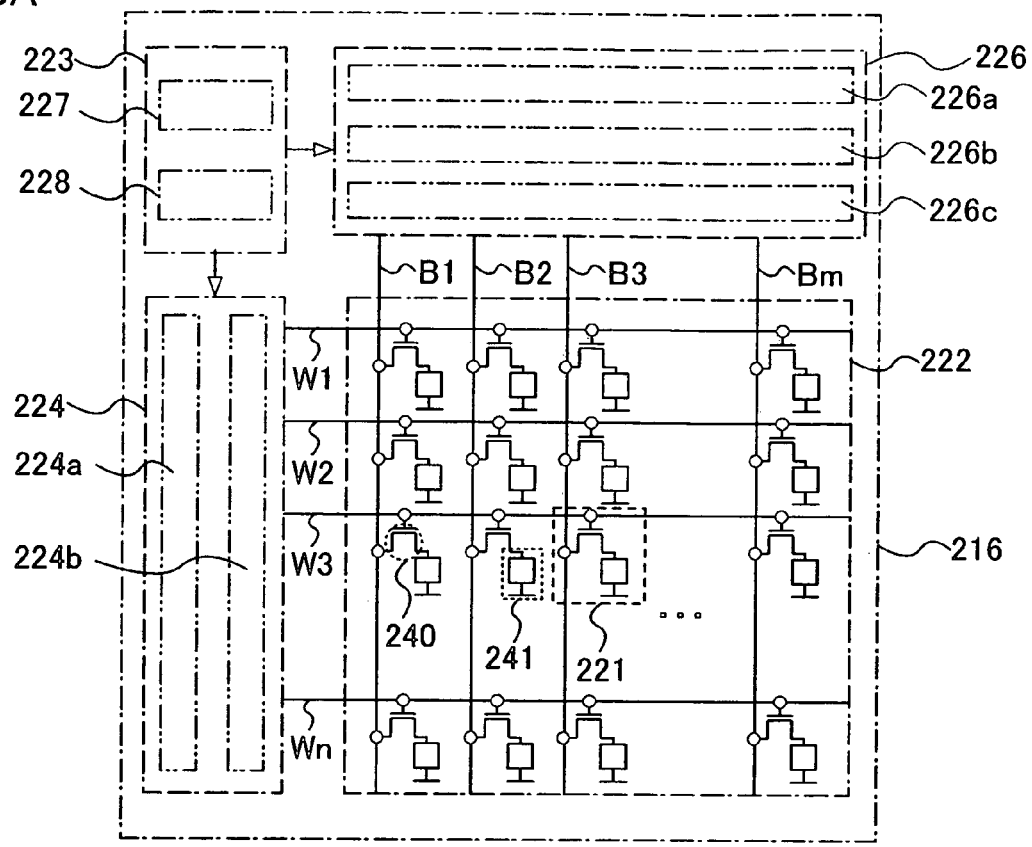
Figure 8B:
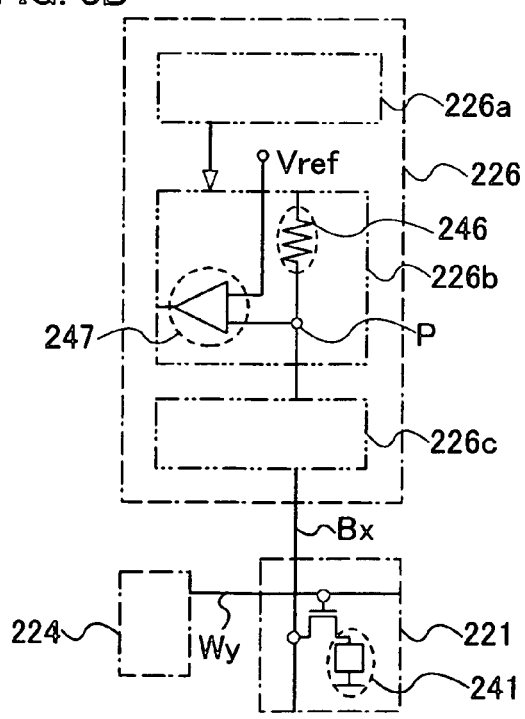
Figure 8C:
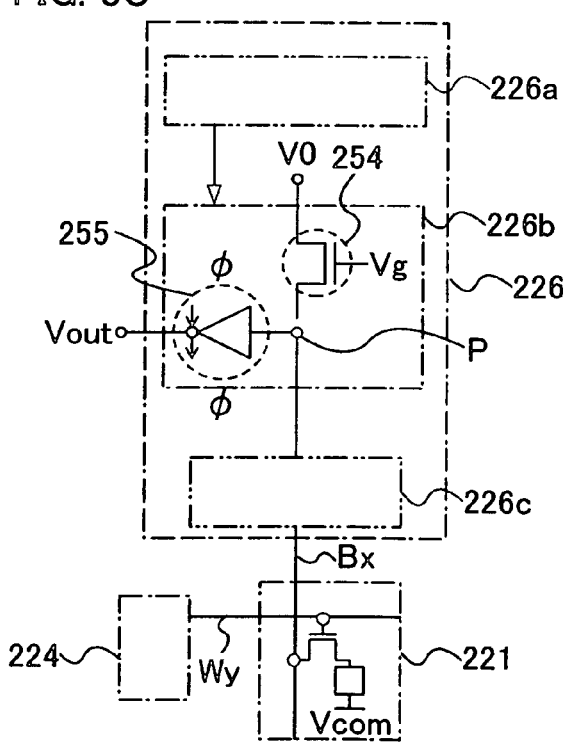

Each of FIGS. 8A to 8C describes a memory device of the present invention.

Figure 9A:
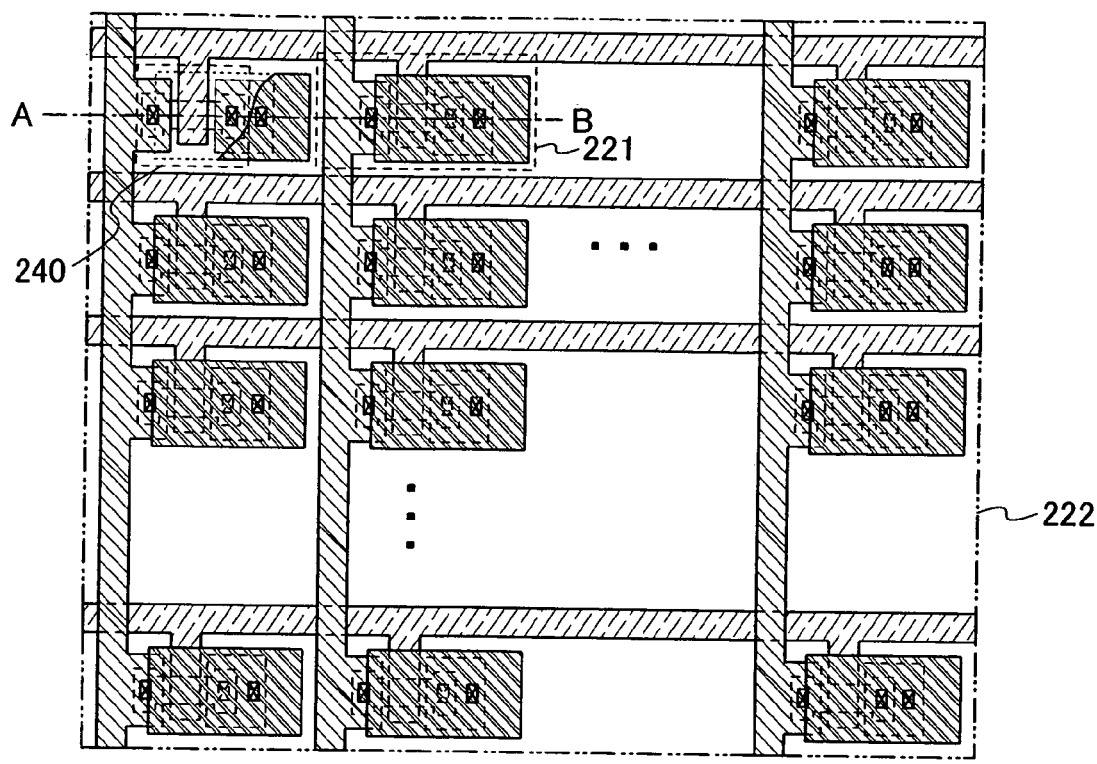
Figure 9B:
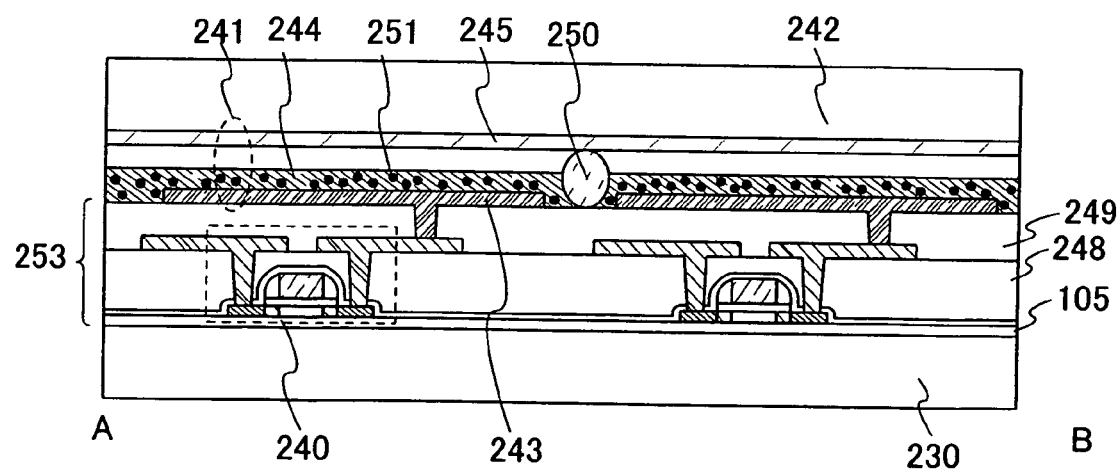

FIGS. 9A and 9B are an upper surface view and a cross-sectional view describing a memory device of the present invention.

Figure 10A:
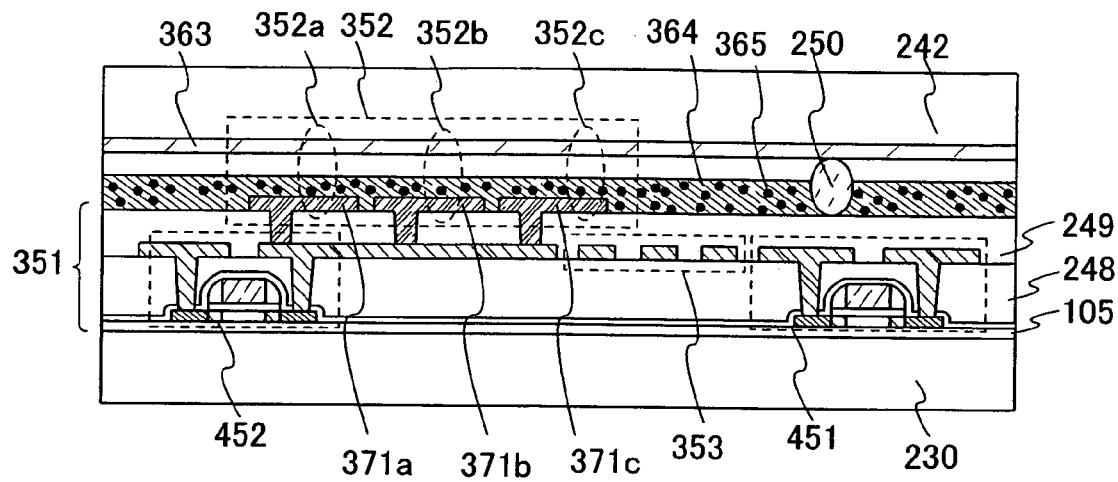
Figure 10B:
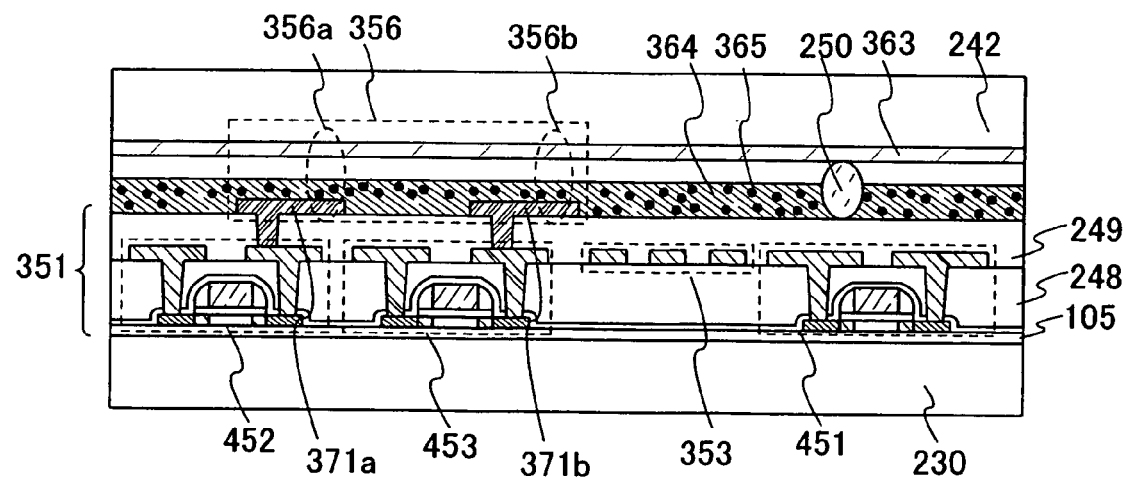

Each of FIGS. 10A and 10B is a cross-sectional view describing a semiconductor device of the present invention.

Figure 11:
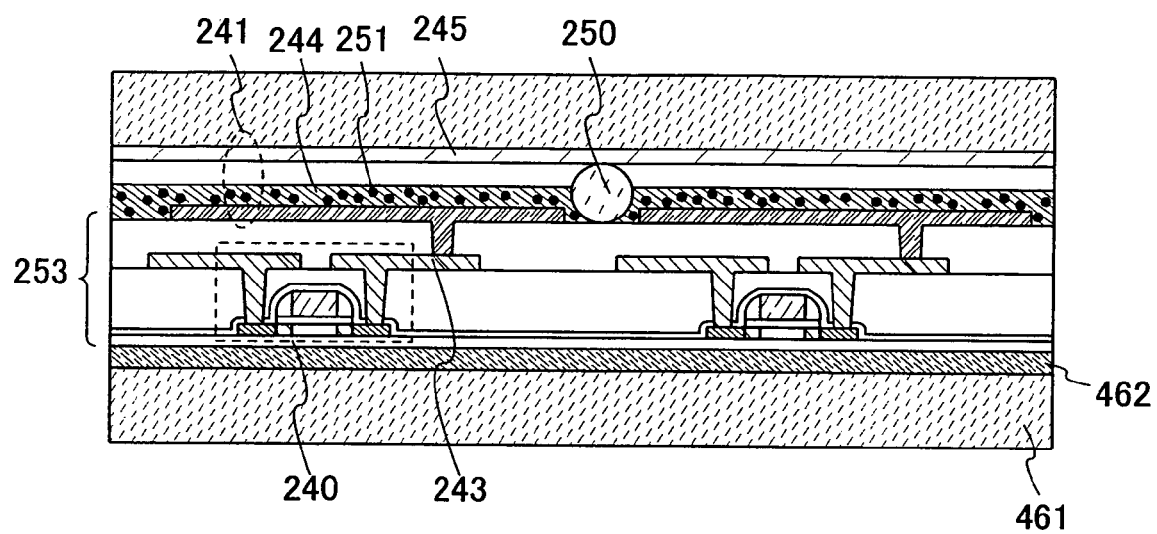

FIG. 11 is a cross-sectional view describing a semiconductor device of the present invention.

Figure 12:
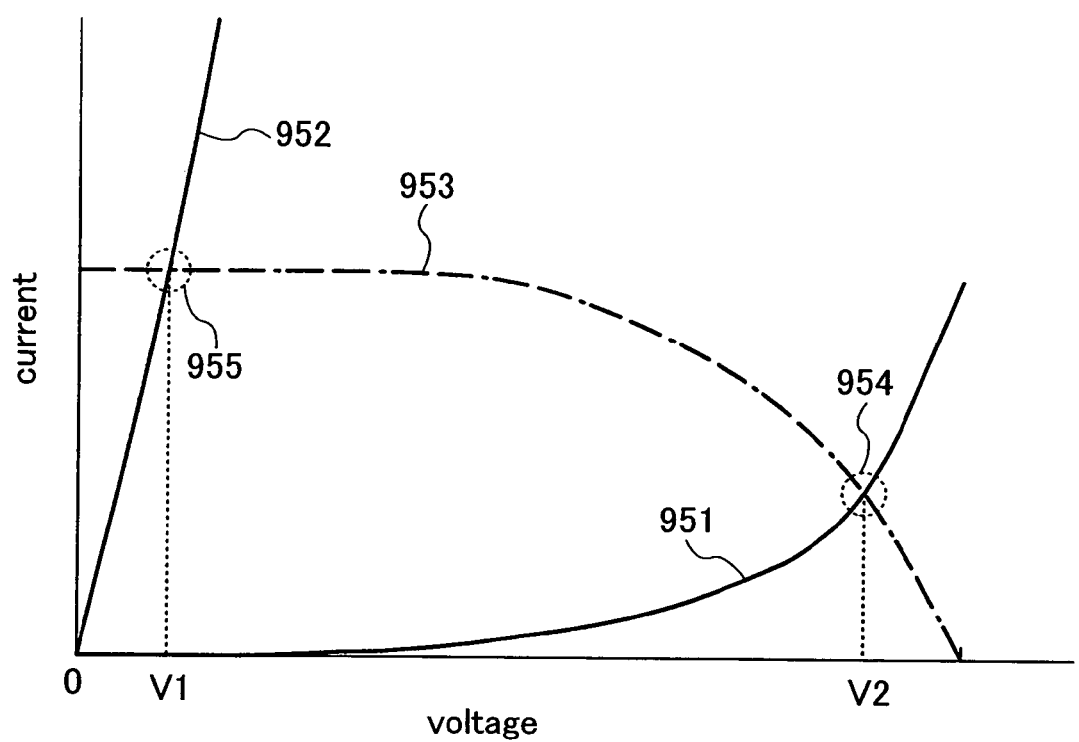

FIG. 12 describes current-voltage characteristics of a memory element and a resistance element.

Figure 13A:
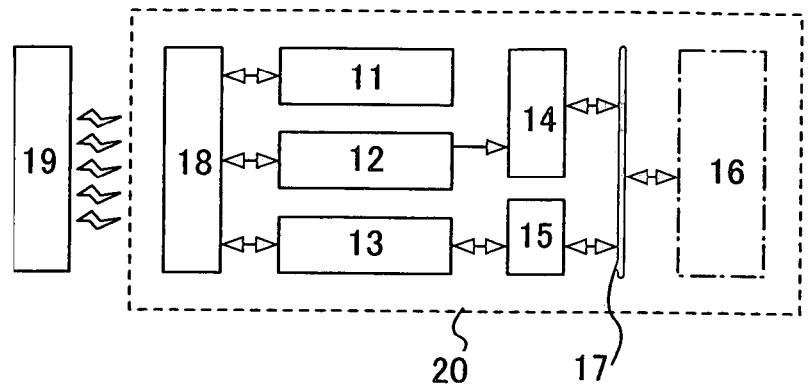
Figure 13B:
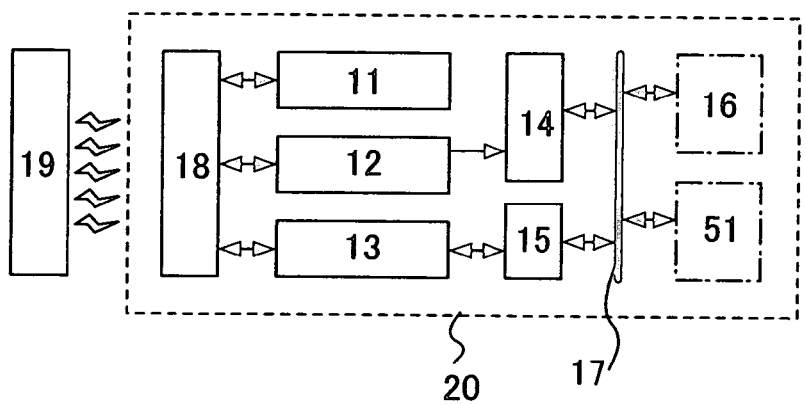
Figure 13C:
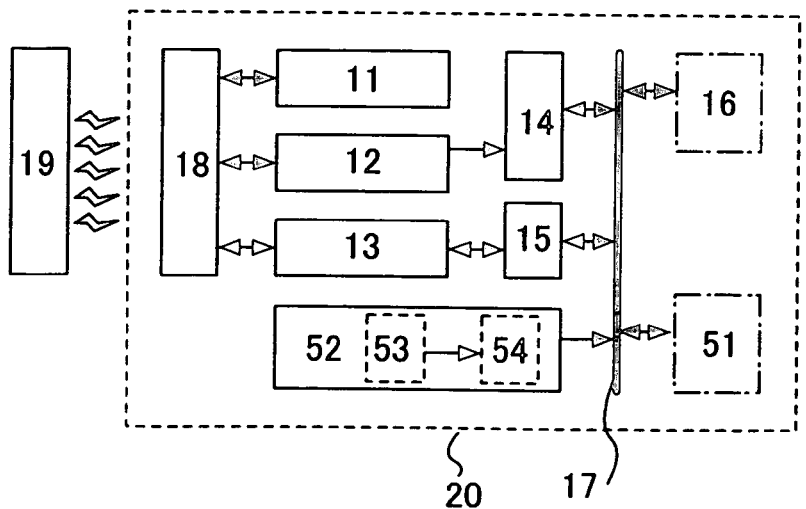
Figure 14A:
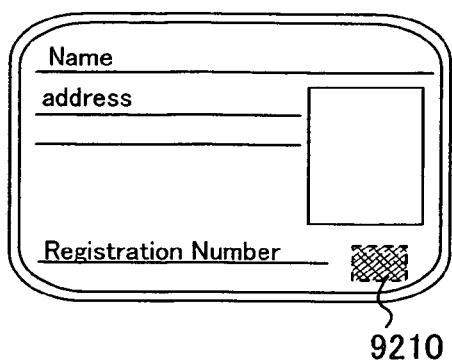
Figure 14B:
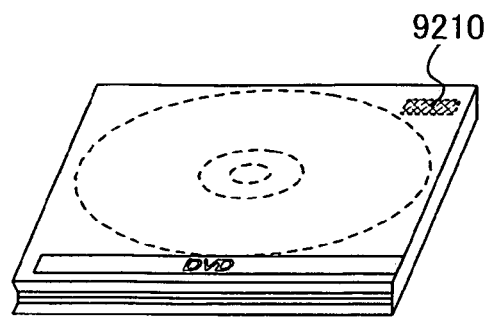
Figure 14C:
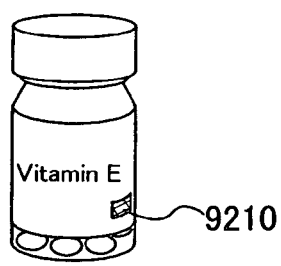
Figure 14D:
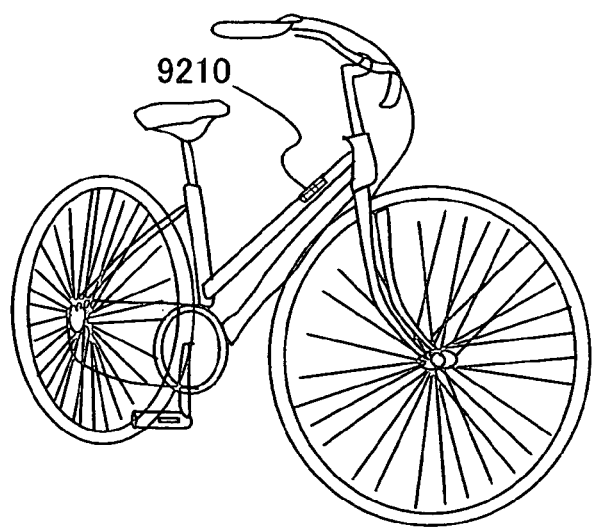
Figure 14E:
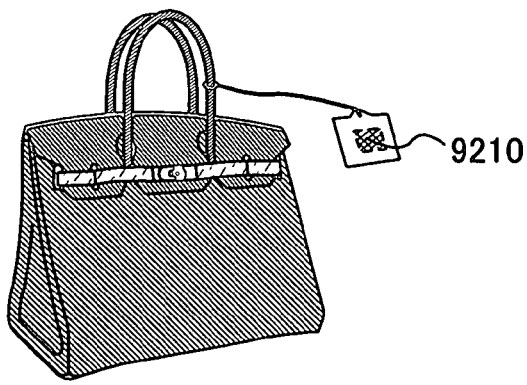
Figure 14F:
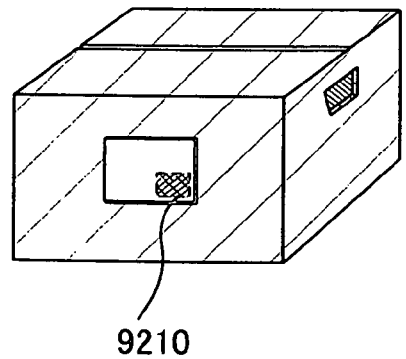

Each of FIGS. 13A to 13C describes a structural example of a semiconductor device of the present invention.

Each of FIGS. 14A to 14F describes a type of usage for a semiconductor device of the present invention.

Figure 15:
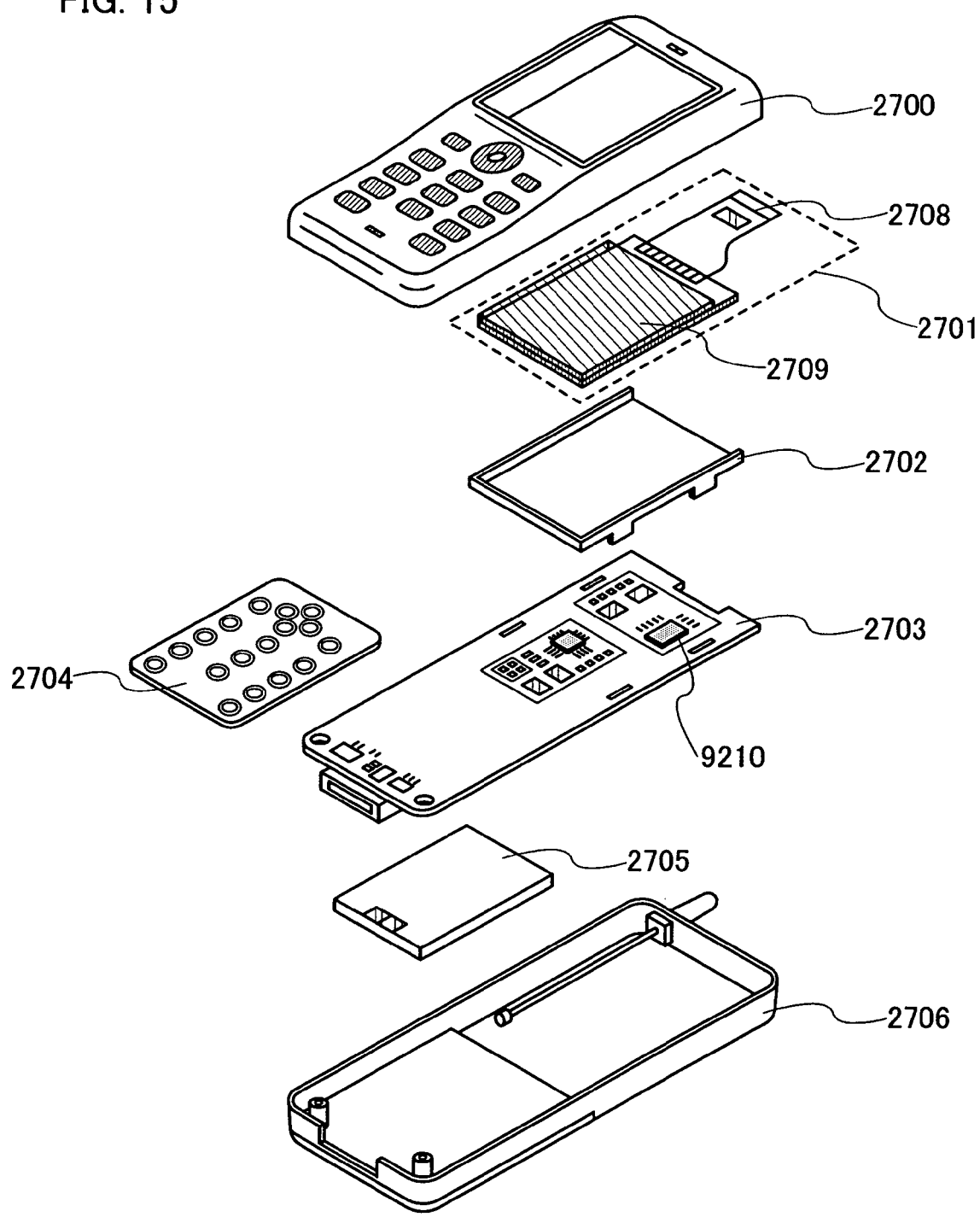

FIG. 15 describes an electronic appliance including a semiconductor device of the present invention.

Each of FIGS. 16A to 16D is a cross-sectional view describing a transistor that can be applied to the present invention.

Figure 17:
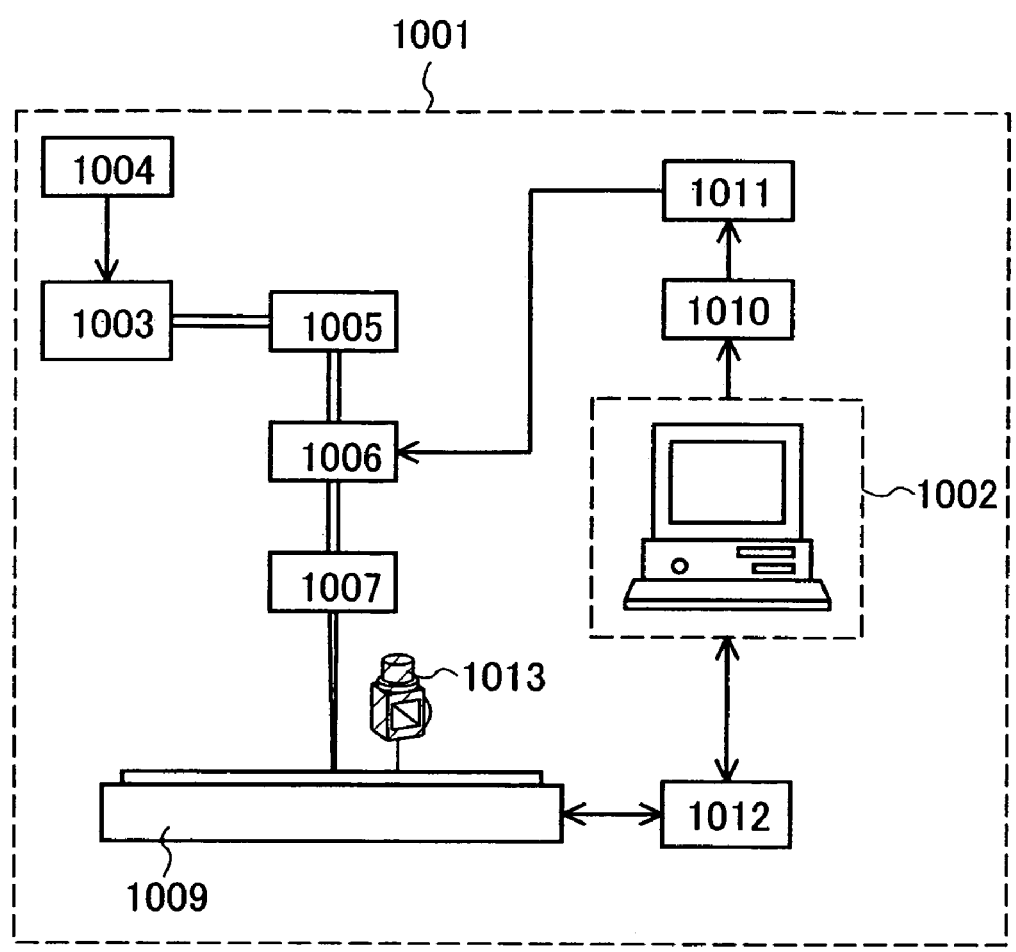

FIG. 17 is a cross-sectional view describing a writing device that can be applied to the present invention.

DETAILED DESCRIPTION OF THE INVENTION

Embodiment Mode

Embodiment modes of the present invention will hereinafter be described based on the accompanying drawings. However, the present invention can be carried out in many different modes, and it is easily understood by those skilled in the art that modes and details herein disclosed can be modified in various ways without departing from the spirit and the scope of the present invention. Therefore, the present invention should not be interpreted as being limited to the description of the embodiment modes to be given below. Note that in all drawings for describing the embodiment modes, the same reference numerals are used for the same portions or the portions having similar functions, and the repeated description thereof is omitted.

Embodiment Mode 1

In this embodiment mode, a structural example of a memory element included in a memory device of the present invention is described with reference to drawings.

Figure 1A:
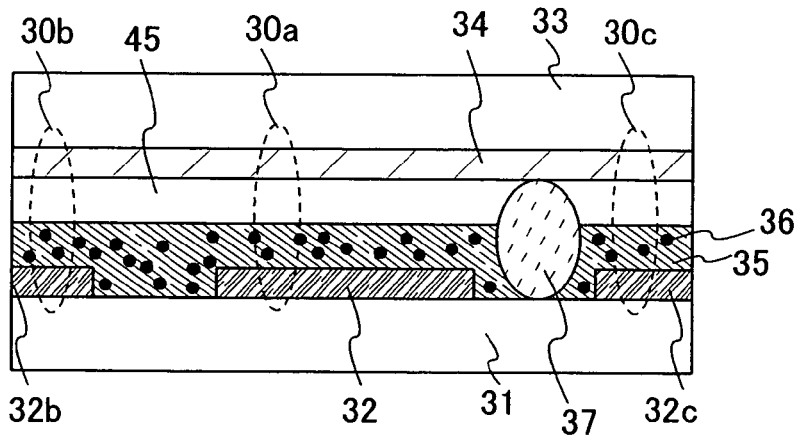
Figure 1B:
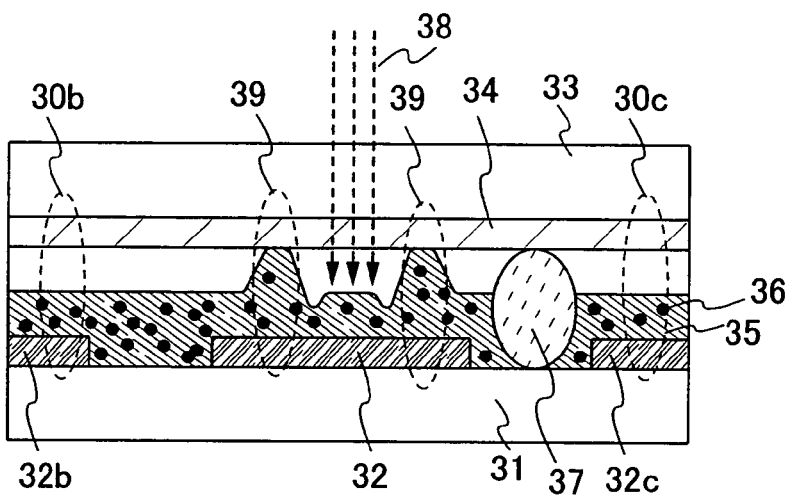
Figure 1C:
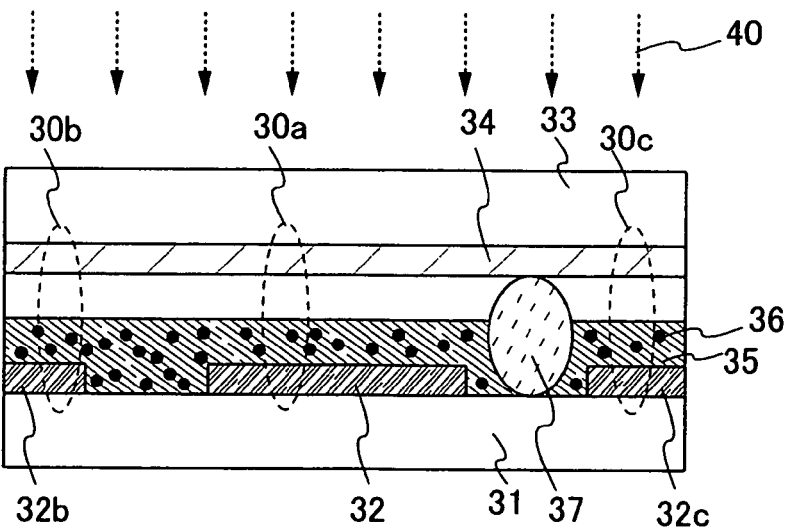

FIGS. 1A to 1C show a cross-sectional structure of a memory element included in a memory device of the present invention, as well as a data writing operation and an erasing operation thereof.

In FIG. 1A, a cross-sectional view of a memory element prior to writing is shown. A memory element 30a included in a memory device of the present invention has a first conductive layer 32 formed over a first substrate 31, a second conducive layer 34 formed adjacent to a second substrate 33, and an organic compound layer 35 that is in contact with the first conductive layer 32 or the second conductive layer 34. Here, the organic compound layer 35 is in contact with the first conductive layer 32. In the organic compound layer 35, conductive particles 36 are dispersed. Also, a region 45 in which a gas is filled is included between the first conductive layer 32 or the second conductive layer 34 and the organic compound layer 35. Further, a space-maintaining material (hereinafter referred to as "spacer") 37 may be provided between the first substrate 31 and the second substrate 33 so that a distance between the first conductive layer 32 and the second conductive layer 34 is maintained to be constant. The first substrate 31, the second substrate 33 and the organic compound layer 35 are sealed together with a sealant. Furthermore, a memory element 30b including a first conductive layer 32b, the organic compound layer 35 in which the conductive particles 36 are dispersed, and the second conductive layer 34; and a memory element 30c including a first conductive layer 32c, the organic compound layer 35 in which the conductive particles 36 are dispersed, and the second conductive layer 34, are formed together with the memory element 30a.

For at least one of the first substrate 31 and the second substrate 33, a substrate having a light transmitting property such as a glass substrate, a quartz substrate, or a flexible substrate is used. For the other first substrate 31 or second substrate 33, other than a substrate having a flexible property such as a glass substrate, a quartz substrate, or a flexible substrate, a silicon substrate, a metal substrate, a stainless-steel substrate or the like can be used. A flexible substrate is a substrate that can be bent (flexible). For example, a plastic substrate and the like made of polycarbonate, polyarylate, polyethersulfone, and the like are given. Also, a film including a thermoplastic resin (made of polypropylene, polyester, vinyl, polyvinyl fluoride, vinyl chloride or the like) can also be used. In addition, for the other first substrate 31 or second substrate 33, a field effect transistor (FET) formed over a substrate of Si or the like, or a thin film transistor (TFT) formed over a glass substrate or the like can be used. Here, glass substrates are used for the first substrate 31 and the second substrate 33.

Also, for the first conductive layer 32 and the second conductive layer 34, a single-layer or a laminated-layer structure of a metal, alloy, compound or the like with high conductivity can be used. Note that at least one of the first conductive layer 32 and the second conductive layer 34 is formed using a conductive layer having a light transmitting property.

As representative examples of the metal, alloy, compound or the like with high conductivity, the following can be given. Titanium (Ti), gold (Au), platinum (Pt), nickel (Ni), tungsten (W), chromium (Cr), molybdenum (Mo), iron (Fe), cobalt (Co), copper (Cu), palladium (Pd), and a nitride thereof and the like (for example, titanium nitride (TiN), tungsten nitride (WN), and molybdenum nitride (MoN)); an alkali metal such as lithium (Li) or cesium (Cs), an alkali earth metal such as magnesium (Mg), calcium (Ca) or strontium (Sr), and an alloy including any thereof (MgAg, AlLi); and a rare-earth metal such as europium (Er) or ytterbium (Yb) and an alloy thereof, and the like are given.

As representative examples of the conductive layer having a light transmitting property, light transmitting oxidized conductive films such as indium tin oxide (hereinafter referred to as ITO), ITO containing silicon, ITO containing 2 to 20% of zinc oxide (ZnO), and ITO containing tungsten oxide and zinc oxide is given. The first conductive layer 32 and the second conductive layer 34 are formed by a known sputtering method, evaporation method, CVD method, or the like. Here, an aluminum layer is formed as the first conductive layer 32 and an ITO layer is formed as the second conductive layer 34, by an evaporation method.

The organic compound layer 35 is formed using an organic compound capable of photo-induced surface relief granting system. As the organic compound capable of photo-induced surface relief granting system, an organic compound including a site that can photoisomerize such as an azo group, an alkenyl group, an imine group, and is capable of cis-trans photoisomerization is typically given. As a compound having an azo group, azobenzene, azopyridine, azonaphthalene, or the like is given. As a compound having an alkenyl group, stilbene, stilbazole, stilbazolium, chalcone, cyanine, fulgide, or the like is given. Here, in a stage prior to writing, the organic compound layer is in a cis-form.

Also, as a representative example of the organic compound having an azo group, General Formula (1) shown below can be given.

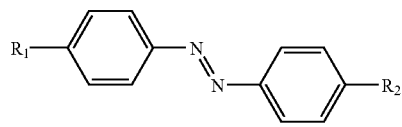

(In General Formula (1), $R_1$ represents an alkyl group of C1 to C8, a cyano group, an aldehyde group, a nitro group, a trifluoromethyl group, or a carboxyl group. $R_2$ is General Formula (2) shown below.)

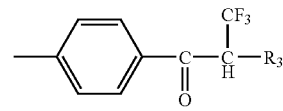

(In General Formula (2), $R_3$ represents an alkyl group of C1 to C8.)

The conductive particles dispersed in the organic compound layer 35 are metal particles, alloy particles, or compound particles that are highly conductive, having diameters of several nm to several ten nm. The metal particles are formed with at least one of titanium (Ti), gold (Au), platinum (Pt), nickel (Ni), tungsten (W), chromium (Cr), molybdenum (Mo), iron (Fe), cobalt (Co), copper (Cu), palladium (Pd), and the like, and the alloy particles are formed with an alloy thereof. Further, the compound particles are formed with a nitride of the foregoing metals, or an oxide having a semiconductor, typically titanium nitride, tungsten nitride, molybdenum nitride, tantalum nitride, molybdenum oxide, tungsten oxide, titanium oxide, copper oxide, vanadium oxide, ytterbium oxide, or the like. Here, gold particles are used.

The organic compound layer 35 can be formed by a known liquid crystal injection method, liquid crystal dropping method, or the like. Also, in a case where the organic compound layer is a low molecular compound, it can be formed by an evaporation method. Note that the organic compound of a low molecular compound is an organic compound having a molecular weight of 2000 or less, preferably 1000 or less. A thickness of the organic compound layer at this time is preferably 100 to 800 nm, or desirably 200 to 500 nm. Also, a distance between a surface of the organic compound layer 35 and the second conductive layer 34 is preferably short, typically 10 to 100 nm, and preferably 20 to 80 nm. If a distance between the pair of conductive layers is shorter than 20 nm, the pair of conductive layers can be short-circuited during manufacturing steps or prior to data writing. Further, if it is longer than 80 nm, the time it takes for a data writing operation is increased, as well as power consumption.

A method of writing data into a selected memory element is described with reference to FIGS. 1B and 17. As shown in FIG. 1B, the organic compound layer 35 including an organic compound in a cis-form is irradiated with a light 38 from a conductive layer having a light transmitting property, which herein is the second conductive layer 34. The light 38 used here preferably has a wavelength which can cause isomerization from a cis-form into a trans-form when the light is absorbed by a site that can photoisomerize. Since the memory device of the present invention is formed using an organic compound having an azo group, an alkenyl group, or an imine group, it is preferable to use a visible light, typically blue light, as light used for data writing for an organic compound having an azo group. For cyanine having an alkenyl group, a visible light, typically green light is preferable. Also, for fulgide having an alkenyl group, a visible light, typically blue light is preferable. Further, for stilbene having an alkenyl group, a visible light, typically orange light is preferable. As a means for irradiation with the light 38, a known light irradiation device that can selectively irradiate a prescribed region with light, such as a laser device, an LED light emitting device or an EL light emitting device can be used.

In a case where the organic compound layer 35 includes azobenzene having an azo group and after the organic compound layer 35 is irradiated with the light 38, a portion of a cis-form is isomerized into a trans-form, as shown in Chemical Formula 3. Note that hv1 in Chemical Formula 3 corresponds to the light 38 shown in FIG. 1B.

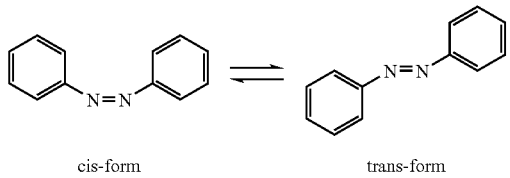

cis-form                      trans-form

Consequently, the periphery of a region irradiated with the light 38 is elevated and projected portions 39 are formed. Specifically, when the organic compound layer 35 is irradiated with light 38, a region irradiated with the light 38 is isomerized from a cis-form to a trans-form. As a result of light scattering and gradient, anisotropic diffusion, as well as intermolecular interaction and the like influencing each other between the cis-form and the trans-form, an edge portion of the region irradiated with the light 38 caves in, and a region formed of an organic compound in a cis-form that is adjacent to the region irradiated with the light 38 becomes elevated. The elevation in the organic compound layer occurs with the organic compound layer still including the dispersed conductive particles 36. For this reason, in the projected portions 39, the first conductive layer 32 and the second conductive layer 34 become connected and short-circuited by the organic compound layer 35 in which conductive particles 36 are dispersed, and the current value and electrical resistance of the memory element 30a are changed. On the other hand, the current values and electrical resistances do not change for the memory elements 30b and 30c that are not irradiated with the light 38, since the first conductive layers 32b and 32c, and the second conductive layer 34 are not connected by the organic compound layer 35. Data writing is possible by such difference between current values or electrical resistances of memory elements.

In a case of irradiation with laser light as the light 38, a change in the electrical resistance of the organic compound layer 35, although it depends on the size of a memory cell 21, is realized by laser light irradiation for which a beam spot is narrowed down to have a diameter of μm or nm, using an optical system such as a lens. For example, when a laser beam with a diameter of 1 μm passes at a velocity of 10 m/sec, the length of time for which the organic compound layer included in each of the memory cells is irradiated with laser light, is 100 nsec. In order to form the projected portions within the short time of 100 nsec, laser power may be 10 mW and power density may be 10 kW/mm$^2$. Furthermore, in a case of selective irradiation with laser light, a pulsed laser irradiation device is preferably used.

Here, an example of a laser irradiation device will be briefly explained with reference to FIG. 17. A laser irradiation apparatus 1001 is equipped with a computer (hereinafter referred to as PC) 1002 which carries out various controls during laser light irradiation; a laser oscillator 1003 which outputs laser light; a power source 1004 of the laser oscillator 1003; an optical system (ND filter) 1005 which attenuates laser light; an acousto-optic modulator (AOM) 1006 for modulating the intensity of laser light; an optical system 1007 which is structured by a lens for condensing a cross-section of laser light, a mirror for changing an optical path, and the like; a movement mechanism 1009 having an x-axis stage and a y-axis stage; a D/A converter portion 1010 for a digital-analog conversion of a control data that is output from the PC; a driver 1011 which controls the AOM 1006 in response to an analog voltage that is output from the D/A converter portion; a driver 1012 which outputs a driving signal for driving the movement mechanism 1009; and an auto-focus mechanism 1013 for focusing laser light on an irradiation object.

As the laser oscillator 1003, a laser oscillator that can oscillate ultraviolet light, visible light, or infrared light can be used. As the laser oscillator, a KrF, ArF, XeCl, Xe excimer laser oscillator or the like; an He, He—Cd, Ar, He—Ne, HF gas laser oscillator or the like; a solid state laser oscillator using a crystal for which YAG, GdVO$_4$, YVO$_4$, YLF, YAlO$_3$ or the like is doped with Cr, Nd, Er, Ho, Ce, Co, Ti, or Tm; or a GaN, GaAs, GaAlAs, InGaAsP semiconductor laser oscillator or the like can be used. As for the solid state laser oscillator, applying the fundamental wave or the second to the fifth harmonic is preferable.

Subsequently, an irradiation method using the laser irradiation device will be described. When a semiconductor device provided with a memory element is attached to the movement mechanism 1009, the PC 1002 detects a position of the memory element which is to be irradiated with laser light, with a camera not shown in the figure. Subsequently, based on the detected position data, the PC 1002 generates a movement data for moving the movement mechanism 1009.

Subsequently, by the PC 1002 controlling the output light amount of the AOM 1006 via the driver 1011, the light amount of laser light that is output from the laser oscillator 1003, after laser light is attenuated by the optical system 1005, is controlled by the AOM 1006 so as to be a prescribed light amount. On the other hand, by the optical system 1007, an optical path and a beam spot form of laser light output from the AOM 1006 are changed, and after light is concentrated by a lens, the memory element is irradiated with light.

At this time, the movement mechanism 1009 is controlled and moved in an x direction and a y direction in accordance with the movement data that is generated by the PC 1002. As a result, a prescribed location is irradiated with laser light, the light energy density of laser light is converted to heat energy, and a memory element can be selectively irradiated with laser light. Note that here, an example of carrying out laser light irradiation by moving the movement mechanism 1009 is described; however, laser light may also be moved in the x direction and the y direction by adjusting the optical system 1007.

Also, instead of the laser irradiation device, an EL light emitting device or an LED light emitting device each having a light emitting element that responds to the memory element can be used.

Subsequently, an operation method for erasing data of a memory element as well as a structure at that time are described with reference to FIG. 1C. A method for erasing data of the memory element is that of heating the organic compound forming the organic compound layer 35 to its glass transition temperature or above, so that it is in a liquid crystal state of an isotropic phase. It may be rapidly cooled afterwards, so that it is in a solid state maintaining the molecular state of the isotropic phase. Consequently, the projected portions of the organic compound layer 35 in contact with the first conductive layer 32 and the second conductive layer 34 become flat, and the first conductive layer 32 and the second conductive layer 34 become insulating.

Alternatively, light having a wavelength by which isomerization from a trans-form into a cis-form occurs, when the light is absorbed by a site that can photoisomerize may be used for light irradiation. In a case where the organic compound layer 35 includes the organic compound having an azo group, when the organic compound layer is irradiated with a light 40 that is an ultraviolet ray, a trans-form turns into a cis-form as shown in the foregoing Chemical Formula 3. Consequently, the projected portions of the organic compound layer become flat, and the first conductive layer 32 and the second conductive layer 34 become insulating. Note that only a memory element for which writing has been carried out, or an entire memory device, may be irradiated with light of a wavelength causing isomerization from a trans-form into a cis-form. Further, hv2 in Chemical Formula 3 corresponds to the light 40 shown in FIG. 1C.

The spacer 37 is preferably provided so that a distance between the first conductive layer 32 and the second conductive layer 34 is maintained to be constant. The spacer 37 including a melamine resin, a urea resin, a polystyrene resin, glass fiber, or silica, is appropriately used. The spacer having a spherical form, a columnar form, a fiber form, or the like is used. Here, the height of the spacer 37 is preferably 300 nm to 1000 nm.

As the sealant for sealing the first substrate 31, the second substrate 33, and the organic compound layer 35, a thermosetting resin, an ultraviolet curable resin, or the like can be used. The sealant typically includes an epoxy resin, a phenol resin, a silicone resin, an acrylic resin, or the like.

Also, in the memory elements 30a to 30c shown in FIG. 1A, elements having rectifying properties may be provided between the first substrate and the first conductive layers 32, 32b and 32c. Also, the elements having rectifying properties may be provided between the first conductive layers 32, 32b and 32c and the organic compound layer 35. Further, the elements having rectifying properties may be provided between the organic compound layer 35 and the second conductive layer 34. Furthermore, the elements having rectifying properties may be provided between the second conductive layer 34 and the second substrate 33. The element having a rectifying property is a transistor for which a gate electrode and a drain electrode are connected to each other, or a diode. As representative examples of the diode, a PN junction diode, a diode having a PIN junction, an avalanche diode, and the like can be given. Also, a diode of another structure may be used. In this manner, by providing elements that have rectifying properties, error is reduced since current only flows in one direction, and the reading margin improves.

Figure 2:
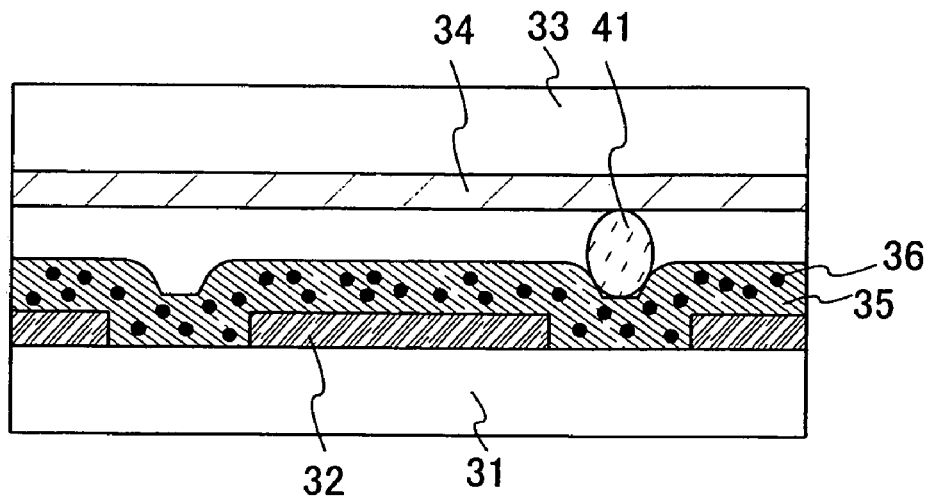
FIG. 2 is a cross-sectional view describing a memory element of the present invention.

Also, as shown in FIG. 2, a spacer 41 may be provided over the organic compound layer 35 in the memory elements 30a to 30c of FIGS. 1A to 1C. In other words, the spacer 41 may be interposed between the organic compound layer 35 and the second conductive layer 34. Such memory element is formed by forming the organic compound layer 35 by a liquid crystal dropping method or an evaporation method, dispersing the spacer thereon, and then sealing them with a pair of substrates.

Figure 3:
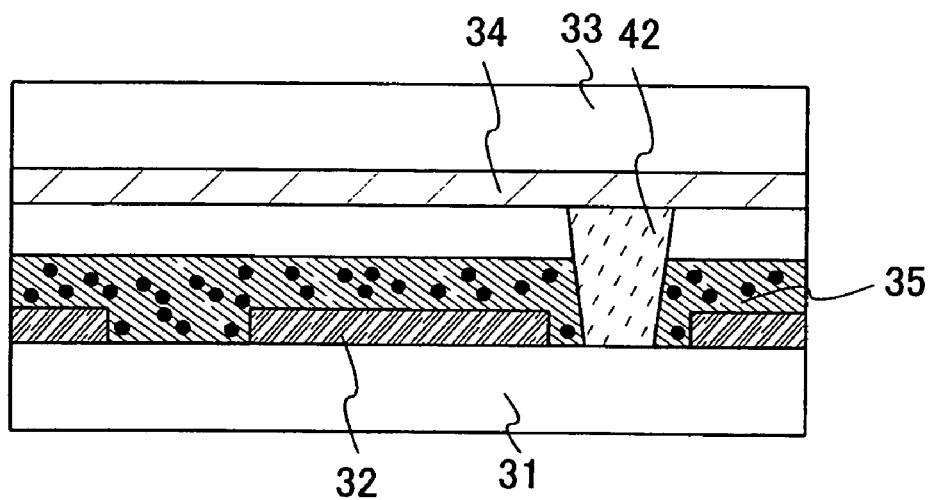
FIG. 3 is a cross-sectional view describing a memory element of the present invention.

Further, as shown in FIG. 3, the spacer may be provided over the second conductive layer 34 or the second substrate 33 in the memory elements 30a to 30c of FIGS. 1A to 1C. Such spacer preferably has a columnar form. In this manner, by forming the spacer adjacent to the second conductive layer 34 or the second substrate 33, a position of the spacer does not change even if the organic compound layer flows, and a distance between the pair of conductive layers can be maintained to be constant.

Also, partitions (insulating layers) 43 may be provided between the first conductive layers 32 as shown in FIGS. 4A and 4B. Note that in a cross-section of the single partition (insulating layer) 43, a side surface of the partition (insulating layer) 43 preferably has an angle of gradient of 10° to 60° with respect to a surface of the single first conductive layer 32, more preferably 25° to 45°. Subsequently, the organic compound layer 35 is formed so as to cover the first conductive layers 32 and the partitions (insulating layers) 43. By providing the partitions (insulating layers) 43, projected portions 44 are formed more easily when a portion of the organic compound layer 35 is irradiated with the light 38, since the organic compound layer is elevated along surfaces of the partitions (insulating layers) 43; consequently, writing is possible with low power consumption.

Also, the memory device of this embodiment mode may include a light irradiation device that is a writing means, and an erasing means. A structural example is described with reference to FIG. 5A.

The memory device shown in FIG. 5A includes a memory element portion 101, an erasing means 102 provided on a side surface of the memory element portion, and a writing means 103 provided on another side surface of the memory element portion.

In the memory element portion 101, a memory element 30 is formed which is structured by the first conductive layer 32 formed over the first substrate 31, the second conductive layer 34 formed adjacent to the second substrate 33, and the organic compound layer 35 in which the conductive particles 36 are dispersed. Also, the first substrate 31, the second substrate 33, and the organic compound layer 35 are sealed together by a sealant 118. Further, the spacer 37 interposed between the first substrate 31 and the second substrate 33 is included.

Here, it is acceptable as long as the second conductive layer 34 has a light transmitting property in a region which faces (overlaps with) the first conductive layer 32. For this reason, a light shielding region 117 may be provided so as to overlap with end portions of the adjacent first conductive layers 32. By providing the light shielding region, a second memory element adjacent to a first memory element can be prevented from being irradiated with light with which the first memory element has been irradiated. Consequently, fluctuations in writing and writing errors can be prevented.

After forming a conductive layer having a light transmitting property adjacent to the second substrate 33, the light shielding region 117 can be formed by selectively doping the conductive layer having a light transmitting property with a noble gas element such as phosphorous, boron, neon, argon, xenon, or krypton. Further, a region of the conductive layer having a light transmitting property that has not been doped with the noble gas element becomes the second conductive layer 34.

Further, the light shielding region 117 may be formed by forming adjacent to the second substrate 33 or the conductive layer having a light transmitting property, a light shielding layer having a conductive property using chromium, titanium, titanium nitride, molybdenum, tungsten, tantalum, tantalum nitride or the like, or an insulating layer absorbing light, and then removing a portion by a photolithography step. Further, the light shielding region may be formed by a droplet discharging method in which a composition having a light shielding property is discharged and then baked. Furthermore, the light shielding region may be formed by a printing method or the like in which a composition having a light shielding property is printed and then baked.

As the writing means 103, an EL or LED light emitting device or the like is provided. Here, an EL light emitting device is described as the light emitting device. The EL light emitting device includes a light emitting element 112 structured by a first conductive layer 113 formed adjacent to a third substrate 111, a layer 114 including a light emitting substance that is formed adjacent to the first conductive layer, and a second conductive layer 115 formed adjacent to the layer 114. Also, on surfaces of the second conductive layer 115 and the layer 114 including a light emitting substance, a protection layer 116 is formed. Note that a conductive layer provided on the memory element 30 side, which is the second conductive layer 115 herein, preferably includes the conductive layer having a light transmitting property.

Note that the light emitting element 112 is provided so as to face the memory element 30 via the second substrate 33.

A known structure can be appropriately used for the light emitting element 112. Here, a blue light emitting element is formed as the light emitting element 112. An aluminum layer with a thickness of 1 nm to 10 nm is formed as the first conductive layer 113. As the layer 114 including a light emitting substance, the following are formed adjacent to the first conductive layer 113: an electron injecting layer of $CaF_2$ with a thickness of 1 nm; an electron transporting layer of Alq3 with a thickness of 40 nm; a blocking layer of SAlq (bis(2-methyl-8-quinolinolato)(triphenylsilanolato)aluminum) with a thickness of 10 nm; a light emitting layer of PPD (4,4'-bis(N-(9-phenanthryl)-N-phenylamino)biphenyl) doped with CBP (4,4'-bis(N-carbazolyl)-biphenyl) with a thickness of 30 nm; and a hole transporting layer of α-NPD with a thickness of 60 nm. The second conductive layer with a thickness of 100 nm includes an ITO containing silicon oxide, adjacent to the layer 114 including a light emitting substance.

As the erasing means 102, a heater 110 including a heating resistor or the like may be provided on a surface of the first substrate 31. Voltage is applied to a pair of conductive layers of a memory element for which writing has been carried out, in order to generate Joule heat so that the organic compound layer is in a liquid crystal state of an isotropic phase, and data may be erased. Further, in a case where the first substrate 31 and the first conductive layer 32 each have a light transmitting property, an ultraviolet ray irradiation device may be provided.

Since compact-sized EL light emitting device and LED light emitting device can be used as the writing means, a memory device having the writing means can be downsized.

Subsequently, a memory device having a different structure from the structure in FIG. 5A is shown in FIG. 5B. The memory device shown in FIG. 5B includes a memory element portion 125, a writing means 126, and the erasing means 102, and compared to the memory device shown in FIG. 5A, a different point is that a second conductive layer 122 of the memory element portion is formed on a surface of the writing means 126.

For the memory element portion 125, the first conductive layer 32 formed over the first substrate 31, and the organic compound layer 35 in which conductive particles 36 are dispersed are formed.

As the writing means 126, an EL or LED light emitting device or the like is provided. Also, the second conductive layer 122 of a memory element is formed on a surface on the light emitting device. Here, an EL light emitting device is described as the light emitting device. The EL light emitting device includes the first conductive layer 113 formed adjacent to a second substrate 120, the layer 114 including a light emitting substance formed adjacent to the first conductive layer 113, and the light emitting element 112 structured by the second conductive layer 115 covering the layer 114 including a light emitting substance. Also, on surfaces of the second conductive layer 115 and the layer 114 including a light emitting substance, interlayer insulating layers 121a and 121b are formed. Further, on surfaces of the interlayer insulating layers 121a and 121b, the second conductive layer 122 of the memory element 30 is formed.

It is preferable that the interlayer insulating layer 121a has a light transmitting property and the interlayer insulating layer 121b has a light shielding property. By providing the interlayer insulating layer 121b having a light shielding property, a second memory element adjacent to a first memory element can be prevented from being irradiated with light with which the first memory element has been irradiated. Consequently, fluctuations in writing and writing errors can be prevented.

Also, the interlayer insulating layer 121a having a light transmitting property may be formed by coating the second conductive layer 115 and the layer 114 including a light emitting substance with an organic insulating material such as an acrylic resin or a polyimide resin, or with an insulating material dissolved in an organic solvent such as a siloxane polymer, and then baking it by a heat process. By forming the interlayer insulating layer 121a using a coating method, flatness can be enhanced. Also, the interlayer insulating layer 121b having a light shielding property is typically formed using an organic resin containing carbon or a black colorant.

The first substrate 31 over which the first conductive layer 32 of the memory element 30 is formed, the second substrate 120 adjacent to which the light emitting element and the second conductive layer 122 of the memory element are formed, and the organic compound layer 35 are sealed together by the sealant 118.

Since the number of substrates can be reduced for a memory device with such structure, reductions in size as well as cost are possible.

Subsequently, a memory device having a different structure from the structure in FIG. 5B is shown in FIG. 5C. The memory device shown in FIG. 5C includes a memory element portion 135, a writing means 136, and the erasing means 102. Also, a different point from the memory device in FIG. 5B is that a common electrode is included, that doubles as the second conductive layer 122 of the memory element portion and the second conductive layer 115 of the light emitting element of the memory device shown in FIG. 5B.

For the memory element portion 135, the first conductive layer 32 formed over the first substrate 31 and the organic compound layer 35 in which the conductive particles 36 are dispersed are formed.

As the writing means 136, an EL or LED light emitting device or the like is provided. Also, a common electrode 131 that doubles as the second conductive layer of the light emitting device and the second conductive layer of the memory element is formed. Here, an EL light emitting device is described as the light emitting device. The EL light emitting device includes the first conductive layer 113 formed adjacent to the second substrate 120, the layer 114 including a light emitting substance formed adjacent to the first conductive layer 113, and the common electrode 131 covering the layer 114 including a light emitting substance. Note that the light emitting element 112 is structured by the first conductive layer 113, the layer 114 including a light emitting substance, and the common electrode 131 functioning as the second conductive layer of the light emitting element. Since the common electrode 131 also functions as the second conductive layer of the memory element 30, the memory element 30 is structured by the first conductive layer 32, the organic compound layer 35 in which conductive particles 36 are dispersed, and the common electrode 131. Also, the first substrate, the second substrate, and the organic compound layer 35 are sealed together by a sealant 118. Further, the spacer 37 interposed between the first substrate and the second substrate is included.

Since the number of substrates can be reduced for a memory device with such structure, reductions in size as well as cost are possible.

The memory device of the present invention is capable of data writing by irradiating with light a memory element including an organic compound having a site that can photoisomerize. Further, data erasing is possible by heating the memory element or irradiating the memory element with light. Consequently, an involatile memory device that is capable of writing and erasing data at a time other than during manufacturing can be manufactured.

Embodiment Mode 2

In this embodiment mode, a structural example of a memory element included in a memory device of the present invention is described with reference to drawings. More specifically, a case where the structure of the memory device is that of a passive matrix type is described.

FIG. 6A shows one structural example of a memory device 16 of this embodiment mode, which includes a memory cell array 22 in which memory cells 21 are provided in a matrix form; a bit line driving circuit 26 including a column decoder 26a, a reading circuit 26b, and a selector 26c; a word line driving circuit 24 including a row decoder 24a and a level shifter 24b; and an interface 23 that interacts with the exterior and includes a writing circuit 25 and an erasing circuit 27. The writing circuit and the erasing circuit are each formed by a boosting circuit, a control circuit and the like. Note that, the structure of the memory device 16 shown here is only one example. Other circuits such as a sense amplifier, an output circuit, and a buffer may be provided, and the writing circuit may be provided in the bit line driving circuit.

The memory cells 21 each include a first conductive layer that structures a bit line Bx ($1 \leq x \leq m$), a second conductive layer that structures a word line Wy ($1 \leq y \leq n$), and an organic compound layer in which conductive particles are dispersed. The organic compound layer in which conductive particles are dispersed is provided between the first conductive layer and the second conductive layer. Note that in FIG. 6B, the memory element is shown by a circuit symbol which expresses a resistance element.

FIGS. 7A and 7B each show an example of an upper surface structure and a cross-sectional structure of the memory cell array 22. Note that FIG. 7A shows the upper surface structure of the memory cell array 22, and FIG. 7B corresponds to the cross-sectional structure of the figure in FIG. 7A taken along a line between A and B. In FIG. 7A, the organic compound layer 35 including the conductive particles 36 and the second substrate 33 are omitted.

In the memory cell array 22, the memory cells 21 are provided in a matrix form (see FIG. 6A). The memory cells 21 each include the memory element 30 (see FIG. 7B). The memory element 30 includes the first conductive layer 32 extending in a first direction over the first substrate 31; the second conductive layer 34 extending in a second direction that is perpendicular to the first direction over the second substrate 33; and the organic compound layer 35 in contact with the first conductive layer 32. Note that the conductive particles 36 are dispersed in the organic compound layer 35.

For the memory element 30, the memory element 30 described in Embodiment Mode 1 can be appropriately applied.

Subsequently, an operation for writing data in a memory element is described (see FIGS. 6A to 7B).

When data is written, the organic compound layer 35 is irradiated with light from a conductive layer having a light transmitting property (the second conductive layer 34 herein). Here, the organic compound layer 35 of a selected memory element is irradiated with light so that the organic compound layer 35 is photoisomerized. Consequently, the periphery of a region irradiated with light is elevated and comes to have a projected shape, so that the first conductive layer 32 and the second conductive layer 34 come into contact via the organic compound layer 35. As a result, an electrical resistance is reduced and a current value is increased compared to those of other memory elements. In this manner, by light irradiation, writing is carried out by utilizing a change in the electrical resistance of the memory element. For example, if a memory element that is not irradiated with light has data "0" and when data "1" is to be written, the organic compound layer of a desired memory element is irradiated with light so that the electrical resistance of the memory element is made low and the current value is made high, by an elevation that accompanies photoisomerization of the organic compound layer.

Subsequently, on operation for reading data from a memory element is described (see FIG. 6B). Here, the reading circuit 26b has a structure including a resistance element 46 and a sense amplifier 47. However, a structure of the reading circuit 26b is not restricted to the foregoing structure, and may be any kind of a structure.

Data reading is carried out by utilizing a difference in the electrical property that is between the first conductive layer and the second conductive layer which structure a memory cell, between a memory cell having data "0" and a memory cell having data "1." As an example, a method of reading utilizing a difference in electrical resistance is explained, where an effective electrical resistance (hereinafter simply referred to as an electrical resistance of a memory cell) between the first conductive layer and the second conductive layer that structure a memory cell having data "0" is R0 at reading voltage, and when an electrical resistance of a memory cell having data "1" is R1 at reading voltage. Note that R1<<R0. Here, the reading circuit 26b has a structure including the resistance element 46 and the sense amplifier 47, and the resistance element 46 has a resistance value Rr for which R1<Rr<R0. However, a structure of the reading circuit 26b is not restricted to the foregoing structure, and may be any kind of a structure. For example, it is also possible to use a transistor 48 instead of the resistance element 46, and a clocked inverter 49 instead of the sense amplifier 47 (see FIG. 7C). In the clocked inverter 49, a signal φ or an inversion signal φ, which becomes Hi when reading is carried out and becomes Lo when it is not carried out, is input.

When reading data from the memory cell 21, the memory cell 21 is selected by the row decoder 24a, column decoder 26a, and the selector 26c. Specifically, by the row decoder 24a, a prescribed voltage Vy is applied to a word line Wy that is connected to the memory cell 21. Also, by the column decoder 26a and the selector 26c, a bit line Bx that is connected to the memory cell 21, is connected to a terminal P of the reading circuit 26b. As a result, an electrical potential Vp of the terminal P is a value that is determined by a resistance division by the resistance element 46 (resistance value Rr) and the memory cell 21 (resistance value R0 or R1). Consequently, when the memory cell 21 has data "0," Vp0=Vy+(V0−Vy)×R0/(R0+Rr). Furthermore, when the memory cell 21 has data "1," Vp1=Vy+(V0−Vy)×R1/(R1+Rr). As a result, in FIG. 7B, by selecting Vref so as to be between Vp0 and Vp1; and in FIG. 5C, by selecting a point of variation of a clocked inverter so as to be between Vp0 and Vp1, reading can be carried out by outputting Lo/Hi (or Hi/Lo) as an output electrical potential Vout, in response to data "0"/"1."

For example, the sense amplifier is operated with Vdd=3V, wherein Vy=0V, V0=3V, and Vref=1.5V. Suppose that R0/Rr=Rr/R1=9, then in a case where data of the memory cell is "0," Vp0=2.7V, and Hi is output as Vout; and in a case where data of the memory cell is "1," Vp1=0.3V, and Lo is output as Vout. In this manner, reading of a memory cell can be carried out.

Instead of the foregoing method, a method of comparing current values is also acceptable. For example, a method that utilizes the satisfaction of Ia1<Ib1, wherein Ia1 is a current value of the memory element 30 when it is not irradiated with light, and Ib1 is a current value of when the memory element 30 is irradiated with light and the organic compound layer elevates.

Note that as an operation for erasing data of a memory element, the operation described in Embodiment Mode 1 can be appropriately used.

The memory device of this embodiment mode is capable of data writing by irradiating with light a memory element including an organic compound having a site that can photoisomerize. Further, data erasing is possible by heating the memory element or irradiating the memory element with light. Consequently, an involatile memory device that is capable of writing and erasing data at a time other than during manufacturing can be manufactured.

Embodiment Mode 3

In this embodiment mode, a memory device having a structure that is different from that of the foregoing Embodiment Mode 2 is described. Specifically, a case where the structure of the memory device is an active matrix type is described.

FIG. 8A shows one structural example of the memory device of this embodiment mode, which includes a memory cell array 222 in which memory cells 221 are provided in a matrix form; a bit line driving circuit 226 including a column decoder 226a, a reading circuit 226b, and a selector 226c; a word line driving circuit 224 including a row decoder 224a and a level shifter 224b; and an interface 223 that interacts with the exterior and includes a writing circuit 227 and an erasing circuit 228. The writing circuit and the erasing circuit are each formed by a boosting circuit, a control circuit and the like. Note that, the structure of the memory device 216 shown here is only one example. Other circuits such as a sense amplifier, an output circuit, and a buffer may be provided, and the writing circuit may be provided in the bit line driving circuit.

The memory cells 221 each include a first wiring that structures a bit line Bx (1≧x≧m), a second wiring that structures a word line Wy (1≧y≧n), a transistor 240, and a memory element 241. The memory element 241 includes between a pair of conductive layers the organic compound layer in which the conductive particles are dispersed.

Subsequently, an upper surface view and a cross-sectional view of the memory cell array 222 having the foregoing structure is described with reference to FIGS. 9A and 9B. Note that FIG. 9A shows one example of the upper surface view of the memory cell array 222, and FIG. 9B shows a cross-sectional view of the figure in FIG. 9A taken along a line between A and B. Note that in FIG. 9A, an organic compound layer 244 in which conductive particles 251 are dispersed, a second substrate 242, and a second conductive layer 245 formed over the second substrate are omitted. Further, a portion of a first conductive layer 243 connected to a source wiring or a drain wiring of the transistor 240 is omitted.

In the memory cell array 222, a plurality of memory cells 221 are provided in a matrix form. In addition, the memory cell 221 includes the transistor 240 functioning as a switching element and the memory element 241 connected to the transistor 240, over a first substrate 230. The memory element 241 is formed over an insulating layer 249 covering the transistor 240, and includes the first conductive layer 243 connected to a source wiring or a drain wiring of the transistor 240, the second conductive layer 245 formed adjacent to the second substrate 242, and the organic compound layer 244 in contact with the first conductive layer 243. Note that in the organic compound layer 244, the conductive particles 251 are dispersed. Also, in order to make constant a distance (cell gap) between the second substrate 242 and the first substrate 230 over which the transistor 240 and the first conductive layer 243 are formed, a spacer 250 may be provided between the insulating layer 249 and the second conductive layer 245. Note that here, the transistor 240, the insulating layer 249 covering the transistor 240, and the first conductive layer 243 are shown as a element formation layer 253 (see FIG. 9B).

For the first conductive layer 243 and the second conductive layer 245, the materials and formation method for the first conductive layer 32 and the second conductive layer 34 described in Embodiment Mode 1 can be appropriately used. Further, as the transistor 240, a thin film transistor is used.

Figure 16A:
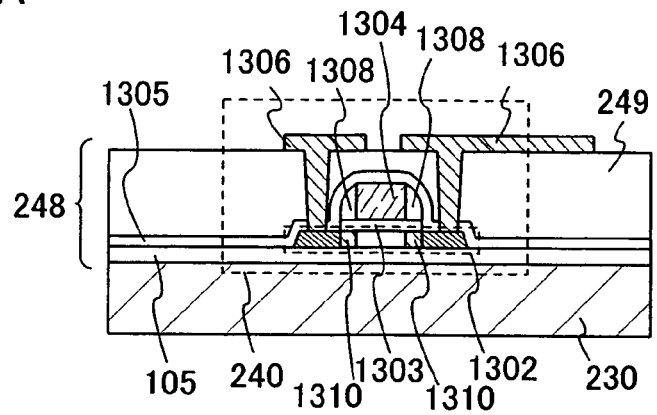

One mode of thin film transistor that can be used for the transistor 240 is described with reference to FIG. 16A. FIG. 16A describes an example where a top gate type thin film transistor is applied. The insulating layer 105 is provided over the first substrate 230, and the thin film transistor is provided over the insulating layer 105. For the thin film transistor, a semiconductor layer 1302 and an insulating layer 1303 that can function as a gate insulating layer are provided over the insulating layer 105. Over the insulating layer 1303, a gate electrode 1304 is formed in response to the semiconductor layer 1302, and an insulating layer 1305 functioning as a protective layer and an interlayer insulating layer 248 are provided thereover. Further, a source wiring or drain wiring 1036 is formed, and each of a source region and a drain region of the semiconductor layer are connected to the source wiring or drain wiring 1036. Furthermore, an insulating layer functioning as a protective layer may be formed thereover.

The semiconductor layer 1302 is a layer formed of a semiconductor having a crystal structure, and a non-single crystal semiconductor or a single crystal semiconductor can be used. In particular, a crystalline semiconductor in which an amorphous or a microcrystalline semiconductor is crystallized by laser light irradiation, a heating process, or a combination of laser light irradiation and a heating process, is preferably applied. For a heating process, a crystallization method using a metal element such as nickel which has an effect of promoting crystallization of a silicon semiconductor can be applied.

In a case where crystallization is done by laser light irradiation, crystallization can be carried out by continuous wave laser light irradiation, or by irradiation with an ultrashort pulsed laser light having a high repetition rate of 10 MHz or more, and a pulse width of 1 nanosecond or less, preferably 1 to 100 picoseconds; wherein a melt zone of a melted crystalline semiconductor is continuously moved in an irradiation direction of the laser light. By such a crystallization method, a crystalline semiconductor having a large grain diameter with a crystal grain boundary extending in one direction can be obtained. By making a drift direction of carriers consistent with the direction in which the crystal grain boundary extends, an electron filed-effect mobility of a transistor can be heightened. For example, a mobility of 400 $cm^2/V \cdot sec$ or more can be realized.

In a case of using the foregoing crystallization step for a crystallization process at or under an allowable upper temperature limit (about 600° C.) of a glass substrate, a large area glass substrate can be used. Consequently, a large amount of semiconductor devices can be manufactured per substrate, and cost reduction is possible.

Also, the semiconductor layer 1302 may be formed by carrying out a crystallization step by heating at or over the allowable upper temperature limit of the glass substrate. Typically, the semiconductor layer 1302 is formed by using a quartz substrate as an insulating substrate, and heating an amorphous or a microcrystalline semiconductor at or over 700° C. As a result, a highly crystalline semiconductor can be formed. Consequently, a thin film transistor with characteristics that are excellent such as response speed and mobility, that is capable of high speed operation, can be provided.

The gate electrode 1304 includes a metal or a polycrystalline semiconductor doped with an impurity imparting one conductivity type. When a metal is used, tungsten (W), molybdenum (Mo), titanium (Ti), tantalum (Ta), aluminum (Al), or the like can be used. Also, a metal nitride for which the foregoing metal is nitrided can be used. Alternatively, a structure may be that of laminating a first layer made of the metal nitride and a second layer made of the metal. In a case of the laminated structure, an end portion of the first layer may stick out from an end portion of the second layer. By making the first layer here a metal nitride, it can be a barrier metal. In other words, the metal of the second layer can be prevented from diffusing to the insulating layer 1303 and the semiconductor layer 1302 that is a layer thereunder.

For side surfaces of the gate electrode 1304, sidewalls (sidewall spacers) 1308 are formed. Each sidewall can be formed by forming an insulating layer that is formed by silicon oxide by a CVD method over a substrate, and then carrying out anisotropic etching by an RIE (reactive ion etching) method.

For the transistor which is formed by combining the semiconductor layer 1302, the insulating layer 1303, the gate electrode 1304, and the like, various structures such as a single drain structure, an LDD (Lightly-Doped Drain) structure, or a gate-overlapped drain structure can be applied. Here, a thin film transistor having a low concentration impurity region 1310 formed in a part of the semiconductor layer that overlaps the sidewall is shown. Moreover, a single gate structure, a multi-gate structure in which transistors to which gate voltage having the same potential equally is applied are serially connected, or a dual gate structure in which gate electrodes sandwich a semiconductor layer on its upper and lower sides, can be applied.

The interlayer insulating layer 248 includes an inorganic insulating material such as silicon oxide or silicon oxynitride, or an organic insulating material such as an acrylic resin or a polyimide resin. In the case of using a coating method such as spin coating or roll coater, the insulating layer is formed by applying an insulating film material dissolved in an organic solvent on the thin film transistor, and then performing a heat treatment thereto. For example, after forming a film including a siloxane bond by a coating method, the insulating layer can be formed by a heat treatment is conducted at 200 to 400° C., using silicon oxide. By using an insulating layer formed by a coating method or an insulating layer which has been flattened by reflow as the interlayer insulating layer 248, it is possible to prevent a wiring to be formed over the layer from breaking. Moreover, the insulating layer can also be used effectively when forming a multilayer wiring.

The source wiring or drain wiring 1306 formed over the interlayer insulating layer 248 can be provided so as to intersect with a wiring to be formed in the same layer as the gate electrode 1304 and has a multilayer wiring structure. The multilayer wiring structure can be formed by forming wires over a plurality of stacked insulating layers which have a similar function to the interlayer insulating layer 248. The source wiring or drain wiring 1306 preferably includes a combination of a low resistant material like aluminum (Al) and a barrier metal using a metal material having a high melting point such as titanium (Ti) or molybdenum (Mo), for example a lamination structure of titanium (Ti) and aluminum (Al), molybdenum (Mo) and Aluminum (Al), or the like.

Figure 16B:
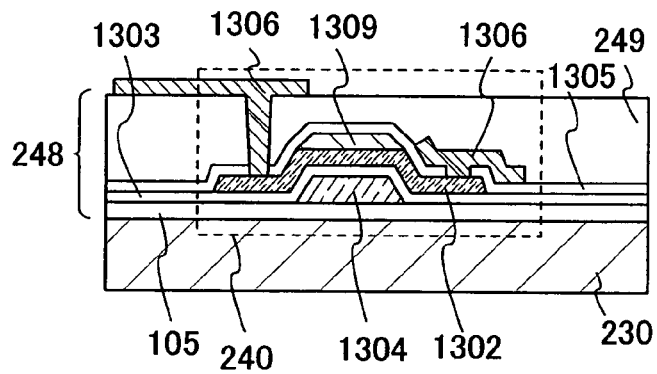

FIG. 16B shows an example of applying a bottom gate type thin film transistor. The insulating layer 105 is formed over the first substrate 230, and the thin film transistor is provided thereover. In the thin film transistor, the gate electrode 1304, the insulating layer 1303 functioning as a gate insulating layer, the semiconductor layer 1302, a channel protection layer 1309, the insulating layer 1305 functioning as a protective layer, and the interlayer insulating layer 248 are provided. Moreover, an insulating layer functioning as a protective layer may be formed thereover. The source wiring or drain wiring 1306 can be formed over the insulating layer 1305 or the interlayer insulating layer 248. In the case of the bottom gate thin film transistor, the insulating layer 105 is not necessary to be formed.

Also, when the first substrate 230 is a substrate having a flexible property, an allowable upper temperature limit of the substrate is lower than that of an inflexible substrate such as a glass substrate. Consequently, the thin film transistor is preferably formed using an organic semiconductor.

Figure 16C:
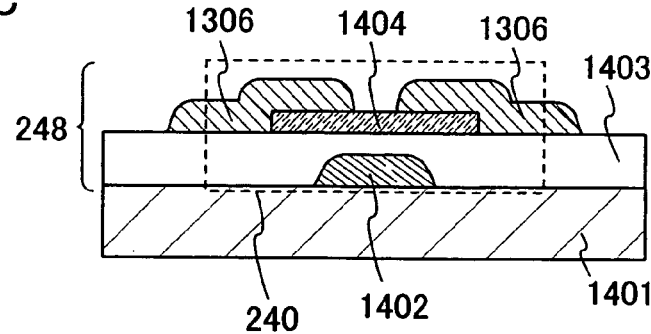

Here, a structure of the thin film transistor using an organic semiconductor is described with reference to FIGS. 16C and 16D. FIG. 16C shows an example of applying a staggered organic semiconductor transistor. An organic semiconductor transistor is provided over a substrate 1401 having a flexible property. In the organic semiconductor transistor, a gate electrode 1402, an insulating layer 1403 functioning as a gate insulating film, a semiconductor layer 1404 which overlaps with a gate electrode and an insulating layer functioning as a gate insulating film, and the source wiring or drain wiring 1306 connecting to the semiconductor layer 1404. Note that the semiconductor layer is partly sandwiched by the insulating layer 1403 functioning as a gate insulating film, and the source and drain wirings 1306.

The gate electrode 1402 can be formed by a similar material and method to the gate electrode 1304 of FIGS. 16A and 16B. Also, the gate electrode 1402 can be formed by drying and baking using a droplet discharging method. Further, the gate electrode 1402 may be formed by printing a paste including fine particles by a printing method over the substrate having a flexible property, and then drying and baking the paste. As a representative example of the fine particles, fine particles mainly including any of gold; copper; an alloy of gold and silver; an alloy of gold and copper; an alloy of silver and copper; or an alloy of gold, silver and copper may be given. Furthermore, the fine particles may mainly include a conductive oxide such as indium tin oxide (ITO).

The insulating layer 1403 functioning as a gate insulating film can be formed by a similar material and method to the insulating layer 1303. However, in a case of forming the insulating layer by a heat process after coating with an insulating film material dissolved in an organic solvent, the heat process temperature is to be lower than the allowable upper temperature limit of the substrate having a flexible property.

As a material for the semiconductor layer 1404 of the organic semiconductor transistor, a polycyclic aromatic compound, a conjugated double bond compound, phthalocyanine, a charge transfer complex, and the like can be given. For example, anthracene, tetracene, pentacene, 6T (hexathiophene), TCNQ (tetracyanoquinodimethane), PTCDA (tetracyanoquinodimethane), NTCDA (naphthalenetetracarboxylic dianhydride), and the like can be given. Further, as a material for the semiconductor layer 1404 of the organic semiconductor transistor, a π-conjugated system high molecular compound such as an organic high molecular compound; a carbon nanotube; polyvinyl pyridine; a phthalocyanine metal complex; and the like can be given. In particular, a π-conjugated system high molecular compound whose skeleton is composed of a conjugated double bond such as polyacetylene, polyaniline, polypyrrole, polythienylene, a polythiophene derivative, poly(3-alkylthiophene), a polyparaphenylene derivative, or a polyparaphenylenevinylene derivative, is preferably used.

As a method for forming the semiconductor layer of the organic semiconductor transistor, a method for forming a film having a uniform thickness over a substrate may be used. The thickness is preferably set to be 1 nm to 1,000 nm, and more preferably, 10 nm to 100 nm. As a specific method, an evaporation method, a coating method, a spin coating method, an overcoat method, a solution cast method, a dipping method, a screen printing method, a roll coater method, or a droplet discharging method can be used.

Figure 16D:
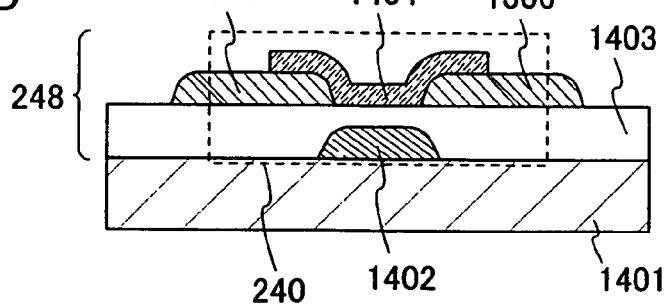

FIG. 16D shows an example of applying a coplanar type organic semiconductor transistor. An organic semiconductor transistor is provided over the substrate 1401 having a flexible property. In the organic semiconductor transistor, the gate electrode 1402, the insulating layer 1403 functioning as a gate insulating film, the source wiring or drain wiring 1306, and the semiconductor layer 1404 which overlaps with a gate electrode and an insulating layer functioning as a gate insulating layer. Also, the source wiring or drain wiring 1306 is partly sandwiched by the insulating layer functioning as a gate insulating layer and the semiconductor layer.

Furthermore, the thin film transistor and the organic semiconductor transistor may have any kind of structure as long as they can function as a switching element.

Also, a transistor may be formed using a single crystal substrate or an SOI substrate, and a memory element may be provided thereover. The SOI substrate may be formed using a method called SIMOX, by which an insulating layer is formed internally by a method of attaching wafers, or by implanting oxygen ions into a Si substrate. Since such transistor including a single crystal semiconductor has characteristics that are excellent such as response speed and mobility, a transistor that is capable of high speed operation can be provided. Also, the transistor has little fluctuation in its characteristics; therefore, a semiconductor device for which high reliability is realized can be provided.

The insulating layer 249 is preferably formed by a heat process after coating with an insulating film material dissolved in an organic solvent by a coating method such as spin coating or roll coater. Consequently, the flatness of a surface of the insulating layer 249 can be improved. Also, regardless of a location of the source wiring or drain wiring 1306 of the transistor, the first conductive layer 243 can be freely positioned. As a result, further integration of the memory element and the transistor is possible.

Materials and formation methods for the first conductive layer 243 and the second conductive layer 245 may be similar to any of the materials and formation methods described in the foregoing Embodiment Mode 1.

Also, the organic compound layer 244 can be provided using a similar material and formation method to those of the organic compound layer 35 shown in the foregoing Embodiment Mode 1.

An element having a rectifying property may be provided between the first conductive layer 243 and the organic compound layer 244. The element having a rectifying property is a transistor for which a gate electrode and a drain electrode are connected to each other, or a diode. Note that the element having a rectifying property may be provided between the organic compound layer 244 and the second conductive layer 245.

For the spacer 250, a spacer that is spherical, columnar or the like can be appropriately used. Although a spherical spacer is dispersed here, a columnar spacer may be formed using an organic resin or the like, over the insulating layer 249 or the second conductive layer 245.

Also, after providing a separation layer over the first substrate 230 and providing the element forming layer 253 over the separation layer, the element forming layer 253 may be separated from the separation layer, and the element forming layer 253 may be attached to a third substrate 461 with an adhesion layer 462 (see FIG. 11). As a separation method, the following methods or the like may be used: (1) a method of separation by providing a metal oxide layer as the separation layer between the first substrate 230 and the element forming layer 253, and then weakening the metal oxide layer by crystallization, and separating the element forming layer 253 by a physical means; (2) a method of providing an amorphous silicon film including hydrogen as the separation layer between the first substrate 230 and the element forming layer 253, and then separating the first substrate 230 by releasing hydrogen gas from the amorphous silicon film through laser light irradiation, or separating the element forming layer 253 by providing an amorphous silicon film as the separation layer and removing the amorphous silicon film by etching; (3) a method of mechanically removing the first substrate 230 where the element forming layer 253 is formed, or etching the first substrate away with the use of a solution or a halogen fluoride gas such as $NF_3$, $BrF_3$, or $ClF_3$; or (4) a method of providing a metal layer and a metal oxide layer as separation layers between the first substrate 230 and the element forming layer 253, and then weakening the metal oxide layer by crystallization as well as etching away a portion of the metal layer with the use of a solution or a halogen fluoride gas such as $NF_3$, $BrF_3$, or $ClF_3$, to physically separate the weakened metal oxide layer.

For the third substrate 461, by using a flexible substrate, a film including a thermoplastic resin, or the like as shown by the first substrate 31 in Embodiment Mode 1, reduction in size, thickness, and weight of a memory device is possible.

Subsequently, an operation for writing data in the memory device 21 is described (see FIGS. 1A to 1C and 8A to 9B).

First, an operation for data writing by light irradiation is described. When data is written, the organic compound layer 35 is irradiated with light from a conductive layer having a light transmitting property (here, the second conductive layer 34). Here, the organic compound layer 35 of a selected memory element is irradiated with light so that the organic compound layer 35 is photoisomerized. Consequently, the periphery of a region irradiated with light is elevated and comes to have a projected shape, so that the first conductive layer 32 and the second conductive layer 34 come into contact via the organic compound layer 35. As a result, compared to other memory elements, an electrical resistance is reduced and an current value is increased. In this manner, by light irradiation, data writing is carried out by utilizing a change in the electrical resistance of the memory element. For example, if a memory element that is not irradiated with light has data "0" and when data "1" is to be written, the organic compound layer of a desired memory element is irradiated with light so that the electrical resistance of the memory element is made low and the current value is made high, by an elevation that accompanies photoisomerization of the organic compound layer.

An operation for data reading by voltage application is explained (see FIGS. 8A to 9B). Data reading is carried out by utilizing a difference in electrical properties of the memory element 241 between a memory cell having data "0" and a memory cell having data "1." As an example, a method of reading utilizing a difference in electrical resistance is explained, where the electrical resistance of a memory element structuring a memory cell having data "0" is R0 at reading voltage, and when the electrical resistance of a memory cell having data "1" is R1 at reading voltage. Note that R1<<R0. Here, the reading circuit 226b includes a resistance element 246 and a sense amplifier 247 for a structure of a reading portion (FIG. 8B). The resistance element has a resistance value Rr for which R1<Rr<R0. It is also possible to use a transistor 254 instead of the resistance element 246, and a clocked inverter 255 instead of the sense amplifier 247 (FIG. 8C). Needless to say, a circuit structure is not limited to that of FIGS. 8A to 8C.

Data reading is carried out by applying voltage between the first conductive layer 243 and the second conductive layer 245, and reading the electrical resistance of the organic compound layer 244. For example, when reading data of a memory cell 221 in column x, row y, among a plurality of the memory cells 221 included in the memory cell array 222, a bit line Bx in column x and a word line Wy in row y are selected by the row decoder 224a, the column decoder 226a, and the selector 226c. Specifically, by the row decoder 224a, a prescribed voltage V24 is applied to a word line Wy that is connected to the memory cell 221, and the transistor 240 is turned on. Also, by the column decoder 226a and the selector 226c, the bit line Bx that is connected to the memory cell 221, is connected to a terminal P of the reading circuit 226b. As a result, an electrical potential Vp of the terminal P is a value determined by a resistance division of Vcom and V0 by the resistance element 246 (resistance value Rr) and the memory element 241. Consequently, when the memory cell 221 has data "0," $Vp0 = Vcom + (V0 - Vcom) \times R0/(R0 + Rr)$. Also, when the memory cell 221 has data "1," $Vp1 = Vcom + (V0 - Vcom) \times R1/(R1 + Rr)$. As a result, in FIG. 8B, by selecting Vref to be between Vp0 and Vp1, and in FIG. 8C, by selecting a point of variation of a clocked inverter to be between Vp0 and Vp1, reading can be carried out by outputting Lo/Hi (or Hi/Lo) as an output electrical potential Vout, in response to data "0"/"1."

For example, the sense amplifier is operated at Vdd=3V, wherein Vcom=0V, V0=3V, and Vref=1.5V. Suppose that R0/Rr=Rr/R1=9, and if an on-resistance of the transistor 240 can be ignored, then in a case where data of a memory cell is "0," Vp0=2.7V, and Hi is output for Vout; and in a case where data of a memory cell is "1," Vp1=0.3V, and Lo is output for Vout. In this way, reading of a memory cell can be carried out.

An operation for reading data from a memory element by voltage application in a case of using a transistor as the resistance element 246 is described by giving a specific example in FIG. 12.

FIG. 12 shows a current-voltage characteristic 951 of a memory element for which writing is not carried out, in other words a memory element with data "0," a current-voltage characteristic 952 of the memory element for which writing of data "1" has been carried out, and a current-voltage characteristic 953 of the resistance element 246, and a case of using a transistor as the resistance element 246 is described herein.

In FIG. 12, in a memory cell including the memory element with data "0," an intersection point 954 of the current-voltage characteristic 951 of the memory element and the current-voltage characteristic 953 of the transistor becomes an operation point, and the potential of the node P at this time is V2 (V). The potential of the node P is supplied to the sense amplifier 247 and in the sense amplifier 247, data that is stored in the foregoing memory cell is judged as "0."

On the other hand, in a memory cell including a memory element for which writing of data "1" has been carried out, an intersection point 955 of the current-voltage characteristic 952 of the memory element and the current-voltage characteristic 953 of the transistor becomes an operation point, and the potential of the node P at this time is V1 (V) (V1<V2). The potential of the node P is supplied to the sense amplifier 247 and in the sense amplifier 247, data that is stored in the foregoing memory cell is judged as "1."

In this manner, by reading a resistance-divided potential in accordance with the resistance value of the memory element 241, data that is stored in the memory cell can be judged.

According to the foregoing method, data is read with a voltage value by utilizing resistance division and a difference in resistance values of the memory element 241. However, data stored in the memory element 241 may be read with a current value.

Note that for an operation for erasing data of the memory element, the operation shown in Embodiment Mode 1 can be appropriately used.

Note that this embodiment mode can be carried out by freely combining it with the foregoing embodiment mode.

The memory device of this embodiment mode is capable of data writing by irradiating with light a memory element including an organic compound having a site that can photoisomerize. Further, data erasing is possible by heating the memory element or irradiating the memory element with light. Consequently, an involatile memory device that is capable of writing and erasing data at a time other than during manufacturing can be manufactured.

Embodiment Mode 4

In this embodiment mode, one example of a semiconductor device including the memory device described in the foregoing embodiment mode is described using drawings.

The semiconductor device that is described in this embodiment mode is characterized in that reading and writing of data is possible without contact. Transmission formats of data are roughly classified into three types, which are: electromagnetic coupling type which carries out communication through mutual induction by positioning a pair of coils so as to face each other; electromagnetic induction type which carries out communication through an induction field; and electric wave type which carries out communication by utilizing electric waves. Any type may be used.

One structural example of a case of a semiconductor device in which an antenna is provided over a substrate, over which a plurality of elements and a memory element are provided, is described with reference to FIGS. 10A and 10B.

FIG. 10A shows a semiconductor device including a memory circuit that is formed as a passive matrix type. The semiconductor device includes transistors 451 and 452 that are formed over the first substrate 230; the insulating layer 249 covering the transistors; an element forming layer 351 including first conductive layers 371a to 371c of a memory element formed over the insulating layer 249 and are connected to the transistor 452, and a conductive layer 353 functioning as an antenna; a second conductive layer 363 that is formed adjacent to the second substrate 242; and an organic compound layer 364 interposed between the first conductive layer 371a to 371c, and the second conductive layer 363. Also, the memory element includes the first conductive layers 371a to 371c, the second conductive layer 363, and the organic compound layer 364 in contact with the first conductive layers 371a to 371c. In the organic compound layer 364, conductive particles 365 are dispersed. Further, the spacer 250 may be provided between the insulating layer 249 and the second conductive layer 363.

The conductive layer 353 functioning as an antenna includes the same layer as a source wiring and a drain wiring of the transistor. Note that it is not limited to this structure, and the conductive layer 353 functioning as an antenna may be formed as a layer under or over the transistor. In this case, as a material for the conductive layer 353 functioning as an antenna, one type of element selected from gold, (Au), platinum (Pt), nickel (Ni), tungsten (W), molybdenum (Mo), cobalt (Co), copper (Cu), aluminum (Al), manganese (Mn), titanium (Ti) and the like; or an alloy or the like including a plurality of the elements can be used. Also, as a formation method of the conductive layer 353 functioning as an antenna, a droplet discharging method, various printing methods such as evaporation, sputtering, a CVD method, screen printing, or gravure printing, or the like can be used.

A memory element portion 352 includes a plurality of memory elements 352a to 352c. Also, the memory element 352a includes the first conductive layer 371a formed over the insulating layer 249, the organic compound layer 364 in which the conductive particles 365 are dispersed, and the second conductive layer 363 formed over the second substrate 242. Further, the memory element 352b includes the first conductive layer 371b formed over the insulating layer 249, the organic compound layer 364 in which the conductive particles 365 are dispersed, and the second conductive layer 363 formed over the second substrate 242. Furthermore, the memory element 352c includes the first conductive layer 371c formed over the insulating layer 249, the organic compound layer 364 in which the conductive particles 365 are dispersed, and the second conductive layer 363 formed over the second substrate 242. The first conductive layers 371a to 371c are connected to a source wiring or a drain wiring of the transistor 452.

Further, the memory element portion 352 can be formed by appropriately using a similar structure, material, and manufacturing method to those of the memory element described in the foregoing embodiment mode.

In the memory element portion 352, as shown in the foregoing embodiment mode, an element having a rectifying property may be provided between the first conductive layers 371a to 371c and the organic compound layer 364, or between the organic compound layer 364 and the second conductive layer 363. For the element having a rectifying property, the one mentioned above in Embodiment Mode 1 can be used.

For the transistors 451 and 452 included in the element forming layer 351, the transistor 240 described in Embodiment Mode 3 can be appropriately used.

Also, a separation layer and the element forming layer 351 may be formed over the first substrate 230, and then the element forming layer 351 may be separated by appropriately using the separation method described in Embodiment Mode 2, and attached to a substrate using an adhesion layer. For the first substrate, by using the flexible substrate, the film including a thermoplastic resin, or the like as shown by the first substrate 31 in Embodiment Mode 1, reduction in size, thickness, and weight of a memory device is possible.

Further, a sensor connecting to the transistors may be provided. As the sensor, an element which detects temperature, humidity, illuminance, gas, gravity, pressure, sound (vibration), acceleration, and the like by a physical or chemical means is given. The sensor is typically formed by a semiconductor element such as a resistance element, a capacitive coupling element, an inductive coupling element, a photovoltaic element, a photoelectric conversion element, a thermoelectromotive force element, a transistor, a thermistor, or a diode.

FIG. 10B shows an example of a semiconductor device including an active matrix type memory circuit. Note that for FIG. 10B, portions that are different from FIG. 10A are described.

The semiconductor device shown in FIG. 10B includes the element forming layer 351 including the transistors 451 to 453 formed over the first substrate 230, the insulating layer 249 covering the transistors, the first conductive layer 371a of a memory element 356a connected to the transistor 452 and the first conductive layer 371b of a memory element 356b connected to the transistor 453 which are formed over the insulating layer 249, the insulating layer 249 covering the transistors 451 to 453 and the first conductive layers 371a and 371b, and the conductive layer 353 functioning as an antenna; the second conductive layer 363 formed adjacent to the second substrate 242; and the organic compound layer 364 in contact with the first conductive layers 371a and 371b. In the organic compound layer 364, conductive particles 365 are dispersed. The memory element portion 356 includes the memory element 356a and the memory element 356b. The memory element 356a includes the first conductive layer 371a, the second conductive layer 363, and the organic compound layer 364 in contact with the first conductive layer 371a. The memory element 356b includes the first conductive layer 371b, the second conductive layer 363, and the organic compound layer 364 in contact with the first conductive layer 371a. Also, a spacer may be provided between the insulating layer 249 and the second conductive layer 363.

Note that the first conductive layer 371a and the first conductive layer 371b are each connected to a source wiring or a drain wiring of the transistors. In other words, a transistor is provided for every memory element.

Further, the memory elements 356a and 356b can be formed by appropriately using the structure, material and manufacturing method described in the foregoing embodiment mode. Also, in the memory elements 356a and 356b, as mentioned above, an element having a rectifying property may be provided between the first conductive layers 371a and 371b, and the organic compound layer 364, or between the organic compound layer 364 and the second conductive layer 363.

A separation layer and the element forming layer 351 may be formed over the first substrate 230, and then the element forming layer 351 may be separated by appropriately using the separation method described in Embodiment Mode 2, and attached to a substrate having a flexible property using an adhesion layer.

Note that a sensor that connects to the transistors may be provided. As the sensor, an element which detects temperature, humidity, illuminance, gas, gravity, pressure, sound (vibration), acceleration, and the like by a physical or chemical means is given. The sensor is typically formed by an element such as a resistance element, a capacitive coupling element, an inductive coupling element, a photovoltaic element, a photoelectric conversion element, a thermo-electromotive force element, a transistor, a thermistor, a diode, an electrostatic capacitance element, a piezo element, or the like.

Note that the present embodiment mode can be carried out by freely combining it with the foregoing embodiment mode.

By the present embodiment mode, providing a more compact and inexpensive semiconductor device is possible.

Embodiment 1

Here, a structure for a semiconductor device of the present invention is described with reference to FIGS. 13A to 13C. As shown in FIG. 13A, a semiconductor device 20 of the present invention has a function of communicating without contact, and has a power source circuit 11, a clock generating circuit 12, a data demodulation/modulation circuit 13, a control circuit 14 which controls another circuit, an interface circuit 15, the memory device 16, a bus 17, and an antenna 18.

Also, as shown in FIG. 13B, the semiconductor 20 of the present invention has the function of communicating without contact, and may also have a central processing unit 51, in addition to the power source circuit 11, the clock generating circuit 12, the data demodulation/modulation circuit 13, the control circuit 14 which controls another circuit, the interface circuit 15, the memory device 16, the bus 17, and the antenna 18.

Further, as shown in FIG. 13C, the semiconductor device 20 of the present invention has a function of communicating without contact, and may also have a detection portion 52 including a detection element 53 and a detection control circuit 54, in addition to the power source circuit 11, the clock generating circuit 12, the data demodulation/modulation circuit 13, the control circuit 14 which controls another circuit, the interface circuit 15, the memory device 16, the bus 17, the antenna 18, and the central processing unit 51.

The semiconductor device of the present embodiment mode, by a transistor in an element forming layer, through forming the detection portion 52 including the detection element 53 and the detection control circuit 54, in addition to the power source circuit 11, the clock generating circuit 12, the data demodulation/modulation circuit 13, the control circuit 14 which controls another circuit, the interface circuit 15, the memory device 16, the bus 17, the antenna 18, and the central processing unit 51, a semiconductor device that is downsized and has a sensing function, which is capable of transmitting/receiving electric waves can be formed.

The power source circuit 11 is a circuit which generates various power sources that are supplied to each circuit inside the semiconductor device 20, based on an alternating signal that is input from the antenna 18. The clock generating circuit 12 is a circuit which generates various clock signals that are supplied to each circuit inside the semiconductor device 20, based on an alternating signal that is input from the antenna 18. The data demodulation/modulation circuit 13 has a function of demodulating/modulating data that is communicated to/from a reader/writer 19. The control circuit 14 has a function of controlling the memory device 16. The antenna 18 has a function of carrying out transmission/reception of electromagnetic waves or electric waves. The reader/writer 19 controls communication with the semiconductor device and a process relating to data thereof. Note that the semiconductor device is not restricted to the foregoing structure, and for example, the structure may be that of adding other components such as a limiter circuit of power source voltage or hardware only for processing codes.

The memory device 16 has one or a plurality of memory elements selected from those described in Embodiment Modes 1 to 3. Since the memory element including an organic compound layer can simultaneously realize reduction in size and thickness as well as increase in capacity, by providing the memory element including an organic compound layer for the memory device 16, reduction in size and weight of the semiconductor device can be achieved.

The detection portion 52 can detect temperature, pressure, flow rate, light, magnetism, sound (vibration), acceleration, humidity, a gas component, illuminance, a fluid component, and other characteristics by a physical or chemical means. Also, the detection portion 52 includes the detection element 53 which detects a physical amount or a chemical amount, and the detection control circuit 54 which converts the physical amount or the chemical amount detected by the detection element 53 into an appropriate signal such as an electrical signal. The detection element 53 can be formed by such an element as a resistance element, a capacitive coupling element, an inductive coupling element, a photovoltaic element, a photoelectric conversion element, a thermo-electromotive force element, a transistor, a thermistor, a diode, electrostatic capacitance element, or a piezo element. Note that a plurality of detection portions 52 may be provided, and in such a case, a plurality of physical amounts or chemical amounts can be detected simultaneously.

Further, the physical amount mentioned here refers to temperature, pressure, flow rate, light, magnetism, sound (vibration), acceleration, humidity, illuminance and the like, and the chemical amount refers to a chemical substance and the like such as a gas component, and a component included in liquid such as ions. As the chemical amount, other organic compounds such as specific biological materials and the like included in blood, sweat, urine and the like (for example, blood glucose level and the like) are also included. In particular, since in a case where a chemical amount is to be detected, naturally a particular substance is to be selectively detected, a substance which selectively reacts with the substance to be detected is provided in the detection element 53 in advance. For example, in a case of detecting a biological material, it is preferable to provide an enzyme, an antibody molecule, a microbial cell, or the like that selectively reacts with the biological substance that is to be detected by the detection element 53, by fixing it on a high molecular compound or the like.

Embodiment 2

By the present invention, a semiconductor device 9210 functioning as a wireless chip can be formed. The use of a wireless chip is extensive. For example, the semiconductor device 9210 can be used by providing it on items such as bills, coins, securities, bearer bonds, certificates (such as a driver's license or a residence certificate; see FIG. 14A), recording media (such as DVD software or a videotape; see FIG. 14B), packaging cases (such as wrapping paper or bottles; see FIG. 14C), vehicles (such as a bicycle; see FIG. 14D), personal belongings (such as shoes or eyeglasses), food items, plants, clothing, livingware, commodities such as electrical appliances, and baggage tags for baggage (see FIGS. 14E and 14F). The semiconductor device 9210 can also be provided on animals and on the human body. The electrical appliances refer to a liquid crystal display device, an EL display device, a television device (also simply called a TV, a TV receiver, or a television receiver), a cellular phone and the like.

The semiconductor device 9210 of the present invention is fixed on an item by mounting it on a printed-circuit board, affixing it on a surface of the item, or by embedding it into the item, etc. For example, the semiconductor device 9210 is fixed on a book by embedding it in paper, or it is fixed on a packaging case made of an organic resin, by embedding it in the organic resin. Because the semiconductor device 9210 of the present invention realizes compactness in size, thinness, and lightness in weight, it does not detract from the design of an item itself after it is fixed on the item. Also, by providing the semiconductor device 9210 of the present invention on bills, coins, securities, bearer bonds, certificates and the like, an authentication function can be provided, and by utilizing this authentication function, counterfeiting can be prevented. Furthermore, by providing the semiconductor device of the present invention on packaging cases, recording media, personal belongings, food items, clothing, livingware, electronic appliances and the like, improvement in efficiency of inspection systems and the like can be achieved.

One mode of an electronic appliance which the semiconductor device 9210 of the present invention is mounted on is explained with reference to drawings. An example here shows a cellular phone which has casings 2700 and 2706; a panel 2701; a housing 2702; a printed wiring board 2703; an operation button 2704; and a battery 2705 (see FIG. 15). The panel 2701 is detachably incorporated in the housing 2702, and the housing 2702 is fitted to the printed wiring board 2703. The form and size of the housing 2702 is appropriately changed depending on an electronic appliance which the panel 2701 is to be incorporated into. On the printed wiring board 2703, a plurality of packaged semiconductor devices are mounted, and as one of these, the semiconductor device 9210 of the present invention can be used. A plurality of the semiconductor devices of the present invention that are mounted on the printed wiring board 2703 have any of the following functions of a controller, a central processing unit (CPU), a memory, a power source circuit, an audio processing circuit, a transmission/reception circuit and the like.

The panel 2701 is connected to the printed wiring board 2703 via a connection film 2708. The foregoing panel 2701, housing 2702, and printed wiring board 2703 are enclosed inside of the casings 2700 and 2706, along with the operation button 2704 and battery 2705. A pixel region 2709 that is included in the panel 2701 is located so that it is visible from an open window that is provided for the casing 2700.

Note that for the casings 2700 and 2706, an exterior appearance form of the cellular phone is shown as an example; however, an electrical appliance according to this embodiment can transform into various modes depending on its function or use.

As in the above, the semiconductor device of the present invention is characterized by compactness in size, thinness, and lightness in weight. By these characteristics, limited space in the interior of the casings 2700 and 2706 of an electrical appliance can be utilized effectively. Furthermore, the electrical appliance can be downsized.

What is claimed is:

1. A memory device comprising:
    a memory element including a first conductive layer, an organic compound layer including conductive particles dispersed therein, on the first conductive layer, and a second conductive layer having a light transmitting property, over the organic compound layer,
    wherein an organic compound included in the organic compound layer has a site that can photoisomerize, and
    wherein a gas is filled between the organic compound layer and the second conductive layer.

2. The memory device according to claim 1, wherein the gas includes at least one of nitrogen, oxygen, carbon dioxide, and a noble gas.

3. The memory device according to claim 1, wherein the site that can photoisomerize is an azo group, an alkenyl group, or an imine group.

4. The memory device according to claim 1, wherein a portion of the organic compound layer is irradiated with light, a periphery of the irradiated portion is isomerized and becomes a projecting portion, and the second conductive layer comes into contact with the first conductive layer through the projecting portion.

5. The memory device according to claim 1, further comprising:
    a first substrate over which the first conductive layer is formed;
    a second substrate over which the second conductive layer is formed; and
    a sealant for sealing the organic compound layer between the first and second substrates.

6. The memory device according to claim 5, wherein a space-maintaining material is interposed between the first substrate and the second substrate.

7. The memory device according to claim 1, further comprising:
    a light irradiation means provided on a side of the second conductive layer.

8. The memory device according to claim 1, further comprising:
    a heating means provided on a side of the second conductive layer.

9. A memory device comprising:
    a memory element including a first conductive layer, an organic compound layer including conductive particles dispersed therein, on the first conductive layer, and a second conductive layer over the organic compound layer,
    wherein an organic compound included in the organic compound layer has a site that can photoisomerize,
    wherein at least one of the first conductive layer and the second conductive layer has a light transmitting property, and wherein a portion of the organic compound layer is irradiated with light, a periphery of the irradiated portion is isomerized and becomes a projecting portion, and the second conductive layer comes into contact with the first conductive layer through the projecting portion.

10. The memory device according to claim 9, wherein the site that can photoisomerize is an azo group, an alkenyl group, or an imine group.

11. The memory device according to claim 9, further comprising:
a first substrate over which the first conductive layer is formed;
a second substrate over which the second conductive layer is formed; and
a sealant for sealing the organic compound layer between the first and second substrates.

12. The memory device according to claim 11, wherein a space-maintaining material is interposed between the first substrate and the second substrate.

13. The memory device according to claim 9, further comprising:
a light irradiation means provided on a side of a conductive layer having a light transmitting property among the first and second conductive layers.

14. The memory device according to claim 9, further comprising:
a heating means provided on a side of a conductive layer having a light transmitting property among the first and second conductive layers.

15. A memory device comprising:
a memory cell array including memory elements arranged in a matrix form; and
a reading circuit,
wherein each of the memory elements includes a first conductive layer, an organic compound layer including conductive particles dispersed therein, on the first conductive layer, and a second conductive layer having a light transmitting property, over the organic compound layer,
wherein an organic compound included in the organic compound layer has a site that can photoisomerize, and
wherein a gas is filled between the organic compound layer and the second conductive layer.

16. The memory device according to claim 15, wherein the gas includes at least one of nitrogen, oxygen, carbon dioxide, and a noble gas.

17. The memory device according to claim 15, wherein the site that can photoisomerize is an azo group, an alkenyl group, or an imine group.

18. The memory device according to claim 15, wherein a portion of the organic compound layer is irradiated with light, a periphery of the irradiated portion is isomerized and becomes a projecting portion, and the second conductive layer comes into contact with the first conductive layer through the projecting portion.

19. The memory device according to claim 15, further comprising:
a first substrate over which the first conductive layer is formed;
a second substrate over which the second conductive layer is formed; and
a sealant for sealing the organic compound layer between the first and second substrates.

20. The memory device according to claim 19, wherein a space-maintaining material is interposed between the first substrate and the second substrate.

21. The memory device according to claim 15, further comprising:
a light irradiation means provided on a side of the second conductive layer.

22. The memory device according to claim 15, further comprising:
a heating means provided on a side of the second conductive layer.

23. A memory device comprising:
a memory cell array including memory elements arranged in a matrix form; and
a reading circuit,
wherein each of the memory elements includes a first conductive layer, an organic compound layer including conductive particles dispersed therein, on the first conductive layer, and a second conductive layer over the organic compound layer,
wherein an organic compound included in the organic compound layer has a site that can photoisomerize,
wherein at least one of the first conductive layer and the second conductive layer has a light transmitting property, and
wherein a portion of the organic compound layer is irradiated with light, a periphery of the irradiated portion is isomerized and becomes a projecting portion, and the second conductive layer comes into contact with the first conductive layer through the projecting portion.

24. The memory device according to claim 23, wherein the site that can photoisomerize is an azo group, an alkenyl group, or an imine group.

25. The memory device according to claim 23, further comprising:
a first substrate over which the first conductive layer is formed;
a second substrate over which the second conductive layer is formed; and
a sealant for sealing the organic compound layer between the first and second substrates.

26. The memory device according to claim 25, wherein a space-maintaining material is interposed between the first substrate and the second substrate.

27. The memory device according to claim 23, further comprising:
a light irradiation means provided on a side of a conductive layer having a light transmitting property among the first and second conductive layers.

28. The memory device according to claim 23, further comprising:
a heating means provided on a side of a conductive layer having a light transmitting property among the first and second conductive layers.

29. A memory device comprising:
a memory cell array including memory cells arranged in a matrix form; and
a reading circuit,
wherein each of the memory cells includes a transistor and a memory element,
wherein the memory element includes a first conductive layer, an organic compound layer including conductive particles dispersed therein, on the first conductive layer, and a second conductive layer having a light transmitting property, over the organic compound layer,
wherein an organic compound included in the organic compound layer has a site that can photoisomerize, and
wherein a gas is filled between the organic compound layer and the second conductive layer.

30. The memory device according to claim 29, wherein the gas includes at least one of nitrogen, oxygen, carbon dioxide, and a noble gas.

31. The memory device according to claim 29, wherein the site that can photoisomerize is an azo group, an alkenyl group, or an imine group.

32. The memory device according to claim 29, wherein a portion of the organic compound layer is irradiated with light, a periphery of the irradiated portion is isomerized and becomes a projecting portion, and the second conductive layer comes into contact with the first conductive layer through the projecting portion.

33. The memory device according to claim 29, further comprising:
a first substrate over which the first conductive layer is formed;
a second substrate over which the second conductive layer is formed; and
a sealant for sealing the organic compound layer between the first and second substrates.

34. The memory device according to claim 33, wherein a space-maintaining material is interposed between the first substrate and the second substrate.

35. The memory device according to claim 29, further comprising:
a light irradiation means provided on a side of the second conductive layer.

36. The memory device according to claim 29, further comprising:
a heating means provided on a side of the second conductive layer.

37. A memory device comprising:
a memory cell array including memory cells arranged in a matrix form; and
a reading circuit,
wherein each of the memory cells includes a transistor and a memory element,
wherein the memory element includes a first conductive layer, an organic compound layer including conductive particles dispersed therein, on the first conductive layer, and a second conductive layer over the organic compound layer,
wherein an organic compound included in the organic compound layer has a site that can photoisomerize,
wherein at least one of the first conductive layer and the second conductive layer has a light transmitting property, and
wherein a portion of the organic compound layer is irradiated with light, a periphery of the irradiated portion is isomerized and becomes a projecting portion, and the second conductive layer comes into contact with the first conductive layer through the projecting portion.

38. The memory device according to claim 37, wherein the site that can photoisomerize is an azo group, an alkenyl group, or an imine group.

39. The memory device according to claim 37, further comprising:
a first substrate over which the first conductive layer is formed;
a second substrate over which the second conductive layer is formed; and
a sealant for sealing the organic compound layer between the first and second substrates.

40. The memory device according to claim 39, wherein a space-maintaining material is interposed between the first substrate and the second substrate.

41. The memory device according to claim 37, further comprising:
a light irradiation means provided on a side of a conductive layer having a light transmitting property among the first and second conductive layers.

42. The memory device according to claim 37, further comprising:
a heating means provided on a side of a conductive layer having a light transmitting property among the first and second conductive layers.

43. A memory device comprising:
a memory element including a first conductive layer, an organic compound layer including a conductive material in contact with the first conductive layer, and a second conductive layer over the organic compound layer,
wherein a space is provided between the organic compound layer and the second conductive layer,
wherein an organic compound included in the organic compound layer has a site that can photoisomerize,
wherein at least one of the first conductive layer and the second conductive layer has a light transmitting property, and
wherein a gas is filled between the organic compound layer and the second conductive layer.

44. The memory device according to claim 43, wherein a portion of the organic compound layer is irradiated with light, a periphery of the irradiated portion is isomerized and becomes a projecting portion, and the second conductive layer comes into contact with the first conductive layer through the projecting portion.

45. The memory device according to claim 43, further comprising:
a first substrate over which the first conductive layer is formed;
a second substrate over which the second conductive layer is formed; and
a sealant for sealing the organic compound layer between the first and second substrates.

46. The memory device according to claim 45, wherein a space-maintaining material is interposed between the first substrate and the second substrate.

47. The memory device according to claim 43, further comprising:
a light irradiation means provided on a side of a conductive layer having a light transmitting property among the first and second conductive layers.

48. The memory device according to claim 43, further comprising:
a heating means provided on a side of a conductive layer having a light transmitting property among the first and second conductive layers.

49. The memory device according to claim 43, wherein the gas includes at least one of nitrogen, oxygen, carbon dioxide, and a noble gas.

50. A semiconductor device comprising:
a memory element including a first conductive layer, an organic compound layer including conductive particles dispersed therein, on the first conductive layer, and a second conductive layer over the organic compound layer,
a conductive layer functioning as an antenna;
a first transistor connected to the first conductive layer or the second conductive layer of the memory element; and
a second transistor connected to the conductive layer functioning as the antenna,
wherein an organic compound included in the organic compound layer has a site that can photoisomerize, wherein at least one of the first conductive layer and the second conductive layer has a light transmitting property, and wherein a gas is filled between the organic compound layer and the second conductive layer.

51. The semiconductor device according to claim 50, wherein a portion of the organic compound layer is irradiated with light, a periphery of the irradiated portion is isomerized and becomes a projecting portion, and the second conductive layer comes into contact with the first conductive layer through the projecting portion.

52. The semiconductor device according to claim 50, further comprising:
- a first substrate over which the first conductive layer is formed;
- a second substrate over which the second conductive layer is formed; and
- a sealant for sealing the organic compound layer between the first and second substrates.

53. The semiconductor device according to claim 52, wherein a space-maintaining material is interposed between the first substrate and the second substrate.

54. The semiconductor device according to claim 50, further comprising:
- a light irradiation means provided on a side of a conductive layer having a light transmitting property among the first and second conductive layers.

55. The semiconductor device according to claim 50, further comprising:
- a heating means provided on a side of a conductive layer having a light transmitting property among the first and second conductive layers.

56. The memory device according to claim 50, wherein the gas includes at least one of nitrogen, oxygen, carbon dioxide, and a noble gas.

* * * * *